United States Patent [19]
Kamon

[11] Patent Number: 5,815,685
[45] Date of Patent: Sep. 29, 1998

[54] APPARATUS AND METHOD FOR CORRECTING LIGHT PROXIMITY EFFECTS BY PREDICTING MASK PERFORMANCE

[75] Inventor: Kazuya Kamon, Tokyo, Japan

[73] Assignee: Mitsubishi Denki Kabushiki Kaisha, Tokyo, Japan

[21] Appl. No.: 529,177

[22] Filed: Sep. 15, 1995

[30] Foreign Application Priority Data

Sep. 16, 1994 [JP] Japan .................................. 6-221956
Feb. 28, 1995 [JP] Japan .................................. 7-040255
Aug. 10, 1995 [JP] Japan .................................. 7-204837

[51] Int. Cl.$^6$ .................................................. G06F 9/455
[52] U.S. Cl. ................................... 395/500; 364/490
[58] Field of Search .......................... 395/500; 430/5, 430/296, 30; 364/474.02, 468.24, 488–490; 250/492.2; 348/87; 437/32

[56] References Cited

U.S. PATENT DOCUMENTS 5,097,138  3/1992  Wakabayashi et al. .............. 250/492.2
5,424,173  6/1995  Wakabayashi et al. .................. 430/296
5,532,090  7/1996  Borodovsky ................................ 430/5
5,553,274  9/1996  Kiebmann ................................ 395/500

*Primary Examiner*—Kevin J. Teska
*Assistant Examiner*—Dan Fiul
*Attorney, Agent, or Firm*—Leydig, Voit & Mayer

[57] ABSTRACT

An apparatus and method corrects for light proximity effects in exposure of a resist material. A circuit pattern to be formed on the wafer is defined by design data and that data is compressed for processing. The data is employed to prepare an optical projection image for transferring the circuit pattern onto the wafer. Before the pattern is transferred, the size of the pattern on the wafer that will result is predicted, using the optical projection image. The predicted pattern size is compared to the desired pattern size and, if there is sufficient difference, the compressed design data is corrected to produce the desired circuit pattern. Thereafter, the design data that has been corrected is expanded and output for use in the pattern transfer by light exposure using a mask produced according to the invention.

51 Claims, 40 Drawing Sheets

DESIGN DATA

LIGHT-PROXIMITY-
CORRECTED DATA

MASK MAKING

PATTERN TRANSFER
ONTO A WAFER

WAFER PROCESSING

CORRECTION IS NEEDED

CORRECTION IS NOT NEEDED

FIG. 18A
FIG. 18B
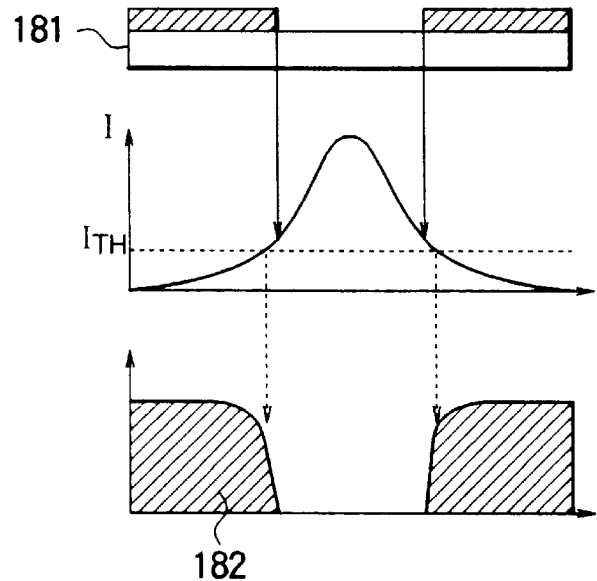
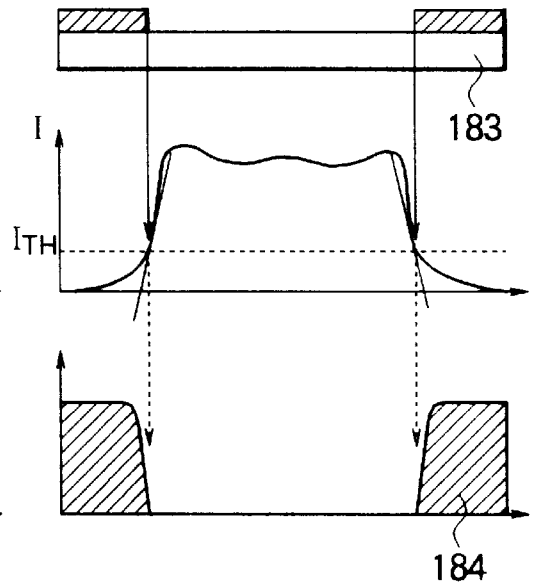
FIG. 19A
FIG. 19B
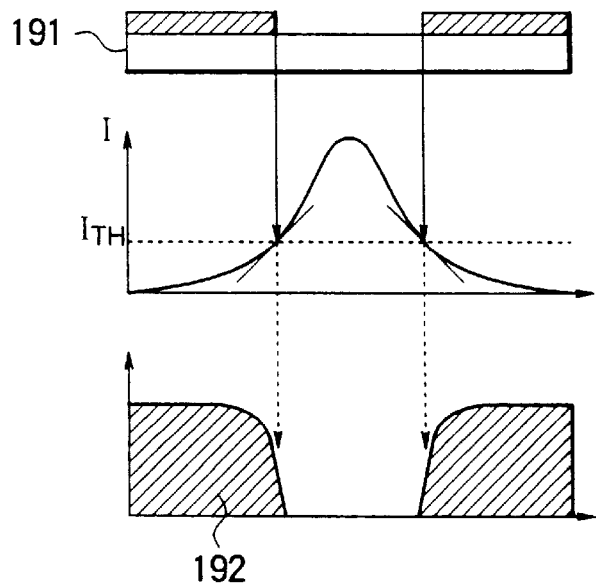
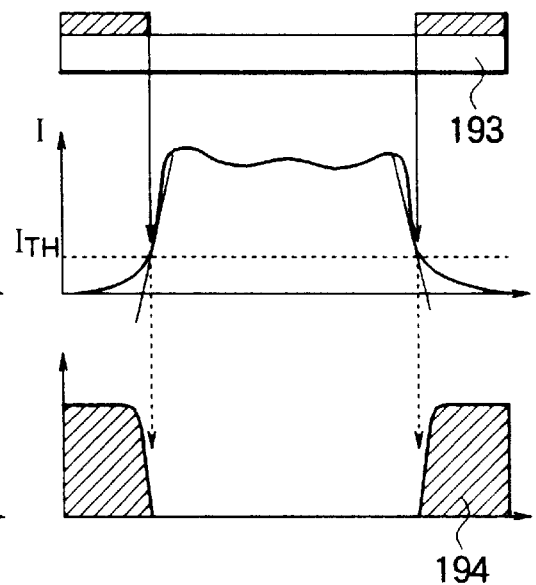

DESIGN DATA

MASK MAKING

PATTERN TRANSFER
ONTO A WAFER

WAFER PROCESSING

FIG. 42A
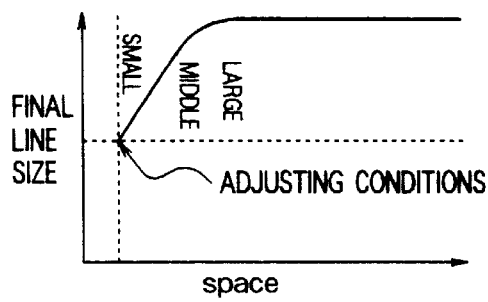
FIG. 42B
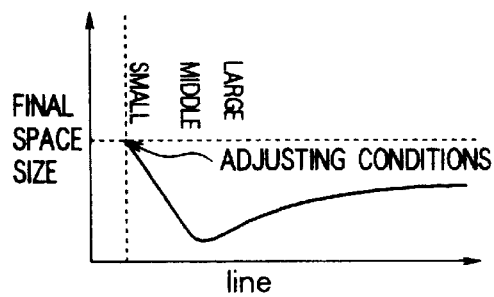
FIG. 43A
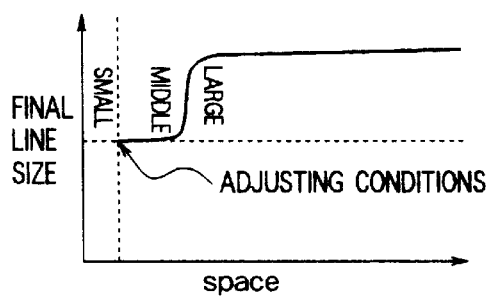
FIG. 43B
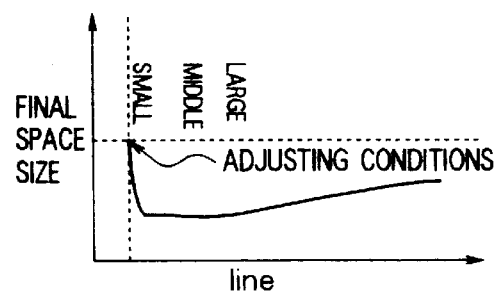
FIG. 44A
| SPACE / LINE | SMALL | MIDDLE | LARGE |
|---|---|---|---|
| SMALL | × ADJUSTING CONDITIONS | ○ | ○ |
| MIDDLE | ○ | × | × |
| LARGE | ○ | × | × |
FIG. 44B
| SPACE / LINE | SMALL | MIDDLE | LARGE |
|---|---|---|---|
| SMALL | × ADJUSTING CONDITIONS | × TWO-LIGHT-RAY INTERFERENCE | ○ |
| MIDDLE | ○ | × | × |
| LARGE | ○ | × | × |

APPARATUS AND METHOD FOR CORRECTING LIGHT PROXIMITY EFFECTS BY PREDICTING MASK PERFORMANCE

BACKGROUND OF THE INVENTION

1. Field of the Invention

The present invention relates to a system and method for correcting pattern data of an integrated circuit or the like so as to cancel the light proximity effects. The present invention also relates to a method of forming a pattern using such a method for correcting light proximity effects.

2. Description of the Related Art

Referring to FIGS. 29A to 29D, a conventional LSI production process will be described below. First, an LSI pattern such as that shown in FIG. 29A is designed using a CAD system or a similar tool and corresponding LSI pattern data is produced. The designed LSI pattern includes a plurality of rectangular patterns 291. Electron beam exposure is then performed according to the designed pattern data so as to produce a mask including a plurality of patterns 292 as shown in FIG. 29B. A wafer is exposed to ultraviolet light through the mask thereby transferring the pattern 292 formed on the mask onto the wafer. However, the pattern transferred to the wafer becomes different from the mask pattern consisting of rectangular patterns 292 owing to diffraction of light in that corners of rectangles are rounded as shown in FIG. 29C. If the wafer is etched or subjected to a similar process using the transferred pattern 293, then the resultant pattern 294 formed on the wafer has further deformation due to the micro coding effect as shown in FIG. 29D. If the wafer is then subjected to an oxidation process to form a local oxidation of silicon (LOCOS) isolation structure, the pattern is deformed further owing to the so-called bird's beak effect.

In production of an integrated circuit such as an LSI, the pattern deformation accumulates via a series of various production processes as described above, and the actual size of the pattern obtained at the end of the production processes is generally different from the designed size.

In recent years, with the reduction in the size of patterns of integrated circuits, it is required to control the pattern size more precisely. In practice, however, there occurs pattern deformation such as that described above during production processes, and electrical characteristics of devices and various margins are influenced by the pattern deformation to a degree that cannot be neglected.

SUMMARY OF THE INVENTION

It is a general object of the present invention to solve the problems described above. More specifically, it is an object of the present invention to provide a light proximity effect correction apparatus and method for alleviating the deformation of patterns due to light proximity effects during production processes of an integrated circuit.

It is another object of the present invention to provide a method of forming a pattern according to such a method of correcting for light proximity effects.

According to a first aspect of the present invention, there is provided a light proximity correction system including: a design data input unit for inputting design data of a circuit pattern; a data compression unit for compressing the design data input via the design data input unit; an optical image formation unit for forming an optical projection image used to transfer a pattern onto a wafer according to the design data input via the design data input unit; a prediction unit for predicting the size of the pattern which will be transferred onto the wafer, the prediction being performed on the basis of the projection image formed by the optical image formation unit; a comparison unit for calculating the difference between the size of the transferred pattern predicted by the prediction unit and the size of the pattern designated by the design data input via the design data input unit; a correction unit for correcting the design data compressed by the data compression unit by an amount equal to the difference determined by the comparison unit; a data expansion unit for expanding the data corrected by the correction unit; and a corrected data output unit for outputting the data expanded by the data expansion unit.

According to a second aspect of the present invention, there is provided a light proximity correction method, including the steps of: compressing design data of a circuit pattern; forming an optical projection image used to transfer a pattern onto a wafer according to the design data; predicting the size of the pattern which will be transferred onto the wafer, the prediction being performed on the basis of the projection image formed in the previous step; correcting the design data by an amount equal to the difference between the predicted size of the transferred pattern and the size of the pattern designated by the design data; expanding the corrected data; and outputting the expanded data.

According to a third aspect of the present invention, there is provided a method of forming a pattern, including the steps of: correcting the light proximity effect which occurs during a process of transferring a pattern onto a wafer, the correction of the light proximity effect being performed on the basis of design data of a circuit pattern, thereby generating corrected data; performing electron beam exposure according to the corrected data thereby producing a mask pattern; performing light exposure through the mask pattern thereby transferring the mask pattern onto a wafer; and processing the wafer using the transferred mask pattern.

BRIEF DESCRIPTION OF THE DRAWINGS

FIGS. 17A, 17B, 18A, and 18B are schematic representations of a correction method according to a twenty-third embodiment of the present invention;

FIGS. 19A, 19B, 20 and 21 are schematic representations of correction methods according to twenty-seventh to twenty-ninth embodiments, respectively, of the present invention;

FIGS. 41A, 41B, 41C, 41D, 42A, 42B, 43A, 43B, 44A, and 44B are schematic representations of a correction method according to a sixth embodiment of the present invention;

DESCRIPTION OF THE PREFERRED EMBODIMENTS

Referring to the accompanying drawings, preferred embodiments of the present invention will be described below.

EMBODIMENT 1

Figure 1A:
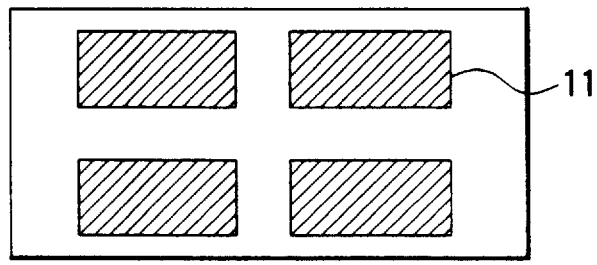
FIGS. 1A to 1E are schematic representations of a series of processing steps of forming a pattern according to a first embodiment of the present invention.
Figure 1B:
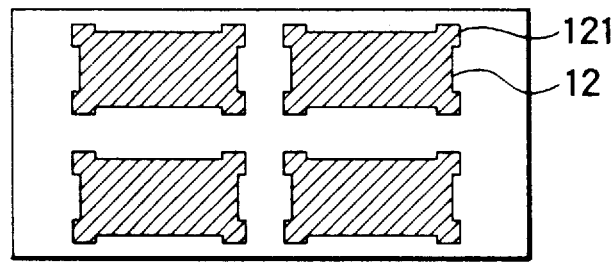

FIGS. 1A–1E are schematic diagrams illustrating a series of processing steps for forming a pattern according to a first embodiment of the present invention. First, an LSI pattern such as that shown in FIG. 1A is designed using a CAD system or a similar tool so as to produce corresponding LSI pattern data consisting of a plurality of rectangular patterns 11. The designed data is then corrected according to the light proximity correction method which will be described in detail later so as to obtain light-proximity-corrected data as shown in FIG. 1B. The light-proximity-corrected data consists of a plurality of patterns 12 corresponding to the plurality of rectangular patterns 11 in the design data wherein each pattern 12 has auxiliary patterns 121 added at each corner so as to correct for pattern deformation due to diffraction of light which occurs during a process for transferring the pattern onto a wafer.

Figure 1C:
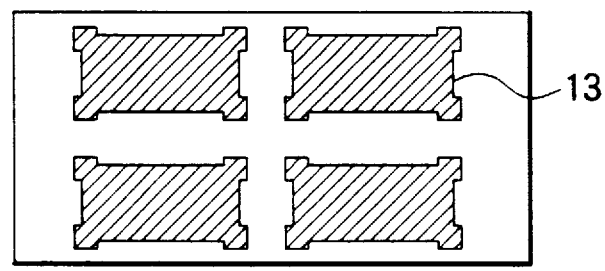
Figure 1D:
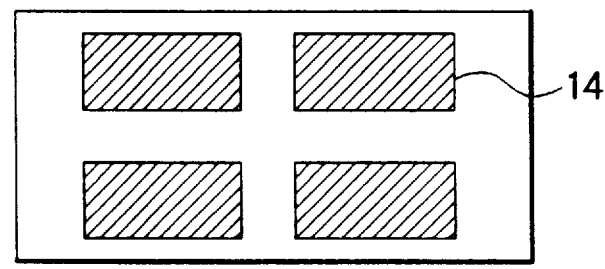

Electron beam exposure is then performed using the light-proximity-corrected data so that a mask including a plurality of patterns 13 is produced as shown in FIG. 1C. A wafer is then exposed to ultraviolet light through this mask thereby transferring the patterns 13 formed on the mask onto the wafer. As a result, as shown in FIG. 1D, patterns 14 are formed on the wafer in such a manner that the auxiliary patterns disposed at four corners at each rectangle are removed as a result of diffraction of light and thus the resultant shape of each pattern 14 becomes a rectangle.

Figure 1E:
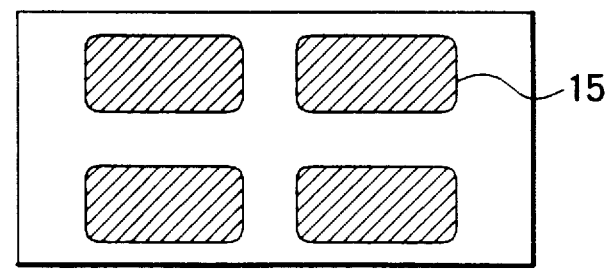
Figure 29A:
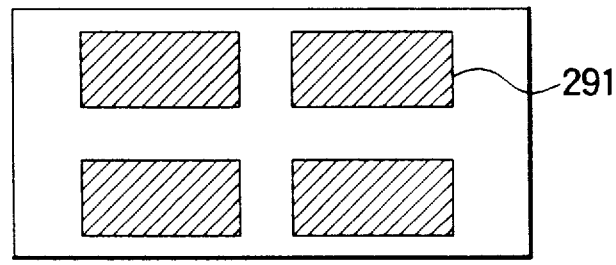
FIGS. 29A to 29D are schematic representations of a series of processing steps of forming a pattern according to a conventional technique.
Figure 29B:
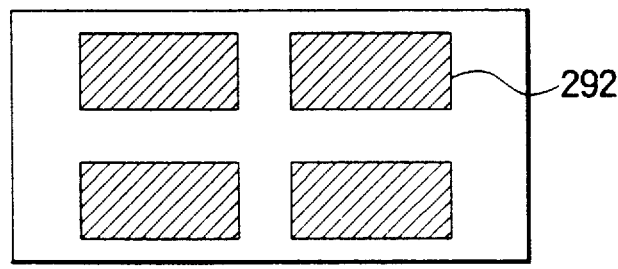
Figure 29C:
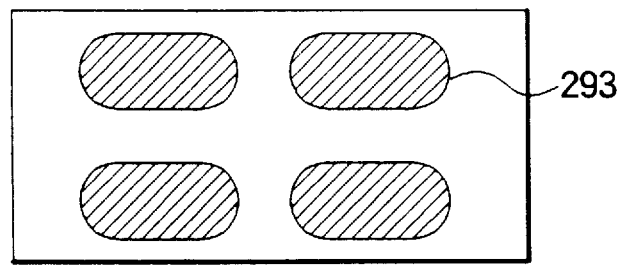
Figure 29D:
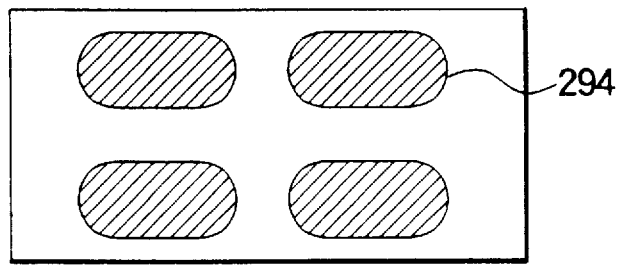

If the wafer is etched using the transferred patterns 14, the etched patterns 15 become such as those shown in FIG. 1E. Although the etched patterns 15 differ from the transferred patterns 14 shown in FIG. 1D owing to the micro loading effect, the deformation is much smaller and thus the pattern is much closer to the design pattern than in the case of the pattern 294 shown in FIG. 29D which is formed according to the conventional technique. Whereas additional deformation occurs in the pattern when the wafer is further subjected to an oxidation process to form a LOCOS isolation structure, the final pattern has higher accuracy than the pattern formed according to the conventional technique.

EMBODIMENT 2

Figure 2:
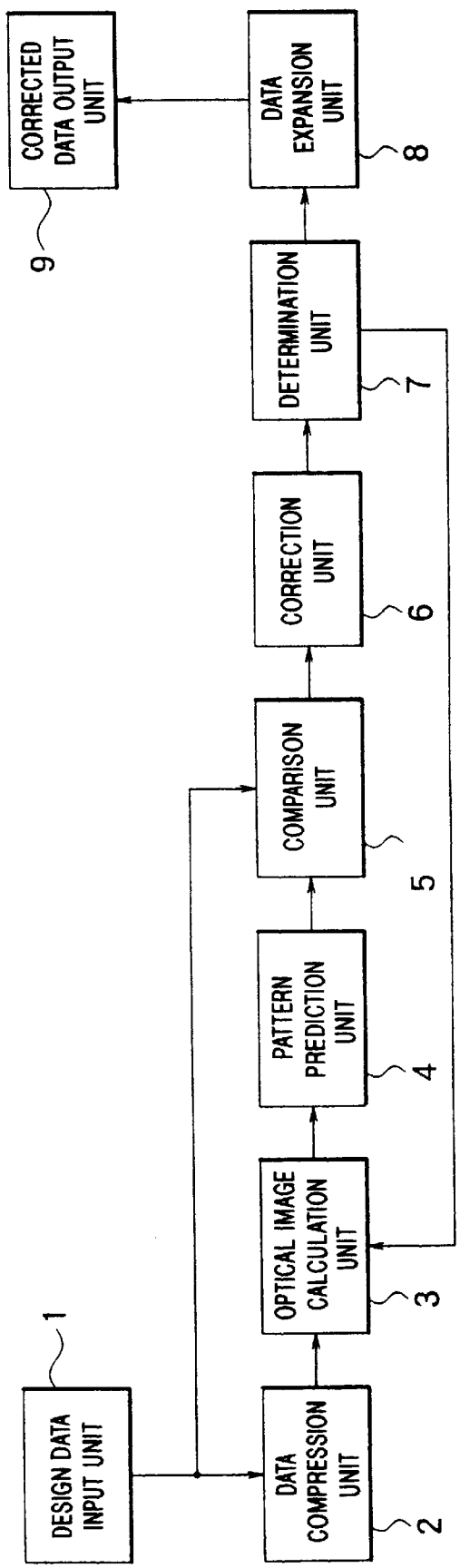
FIG. 2 is a block diagram of a light proximity correction system according to a second embodiment of the present invention.

FIG. 2 is a block diagram illustrating a light proximity correction system used to accomplish the light proximity correction in the pattern formation process described in the first embodiment. Design data of an integrated circuit pattern produced with a CAD system is input to the system via a design data input unit 1. The design data input unit 1 is connected to a data compression unit 2 which performs data compression, in an pre-processing step, on the input data. The output of the data compression unit 2 is connected to an optical image calculation unit 3 for calculating an image which will be projected onto a wafer in a pattern transfer process. The output of the optical image calculation unit 3 is connected to a pattern prediction unit 4 for predicting the pattern which will be formed in a resist as a result of the pattern transfer process. The pattern prediction unit 4 and the design data input unit 1 are connected to a comparison unit 5 for comparing the predicted pattern with the design data. The output of the comparison unit 5 is connected to a correction unit 6 for light proximity correction. The output of the correction unit 6 is connected to a determination unit 7 for determining whether the correction amount is within an allowable range. The output of the unit 7 is connected to a data expansion unit 8 for expanding the data. The output of the data expansion unit 8 is connected to a correction data output unit 9. The output of the unit 7 is also connected to the optical image calculation unit 3. The optical image calculation unit 3 serves as an optical image formation unit defined above in the first aspect of the invention.

Figure 3:
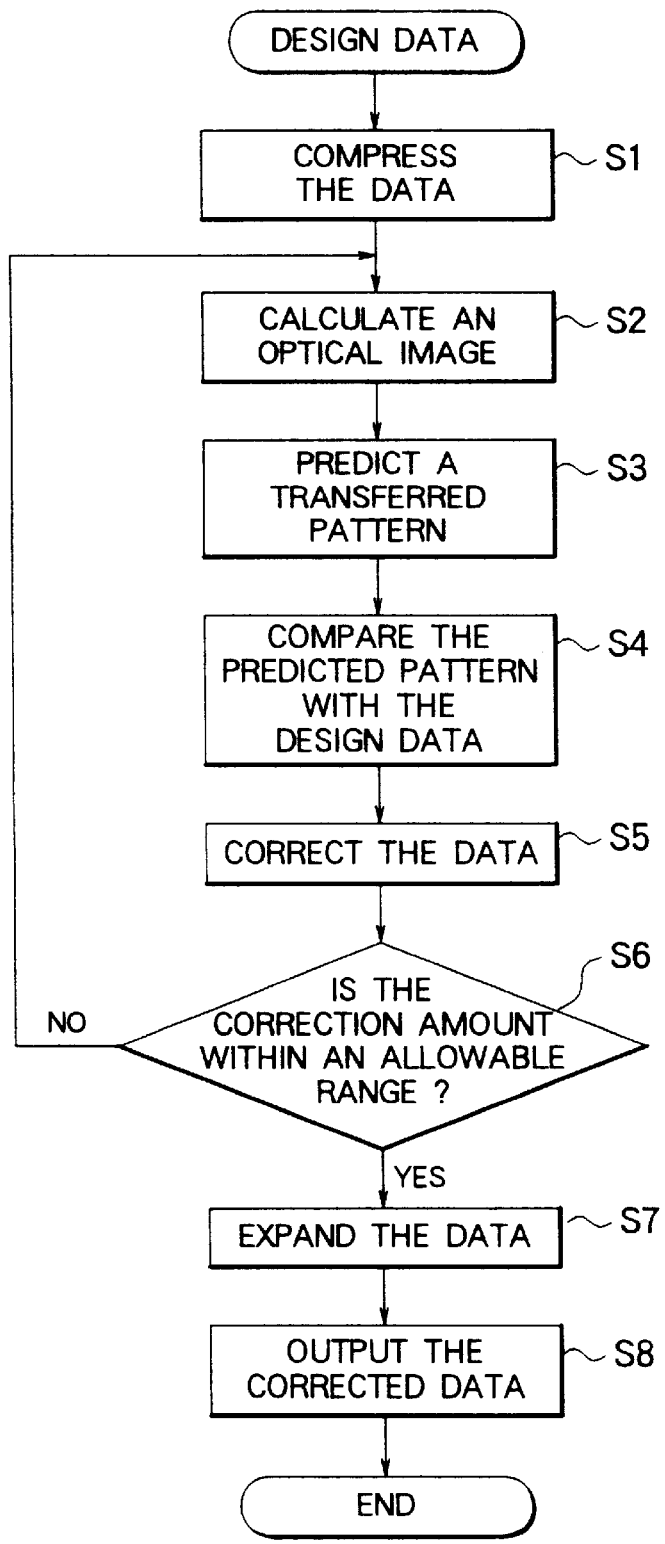
FIG. 3 is a flow chart illustrating an operation relating to the second embodiment of the present invention.

FIG. 3 is a flow chart illustrating the correction method using the light proximity correction system described above. Design data produced with a CAD system or the like is input via the design data input unit 1, and then compressed by the data compression unit 2 in a pre-processing step (step S1). The optical image calculation unit 3 then calculates an image which will be projected onto a wafer from the compressed data (step S2). Furthermore, on the basis of the calculated image to be projected, the pattern prediction unit 4 predicts the size of a pattern which will be finally obtained after a pattern transfer process (step S3). The comparison unit 5 compares the predicted pattern size with the size of the design pattern which was input via the design data input unit 1, and outputs a correction amount which is a difference between the predicted pattern size and the design value (step S4). The correction unit 6 corrects the compressed data according to the correction amount given by the comparison unit 5 (step S5).

Then the determination unit 7 determines whether the correction amount is within the predefined allowable range (step S6). If the correction amount is not within the allowable range, it is considered that the correction is not good enough, and thus the process returns to step S2 so as to calculate the projection image again and correct the data again in steps S3 to S5. Steps S2 to S6 are performed repeatedly until the correction value falls within the allowable range. If it is concluded in step S6 that the correction amount has fallen within the allowable range, it is considered that the light proximity correction is properly completed. Thus the data expansion unit 8 expands the data (step S7) and the corrected data is output via the correction data output unit 9 (step S8). The corrected data is input to an electron beam exposure apparatus (not shown) for producing a mask.

Since data correction is performed according to the result of comparison between the predicted pattern and the design pattern after the data is compressed by the data compression unit 2, a reduction in the correction calculation time is achieved. Furthermore, data correction is performed repeatedly until the correction amount falls within the allowable range so that the final pattern size has a required accuracy.

EMBODIMENT 3

Figure 4:
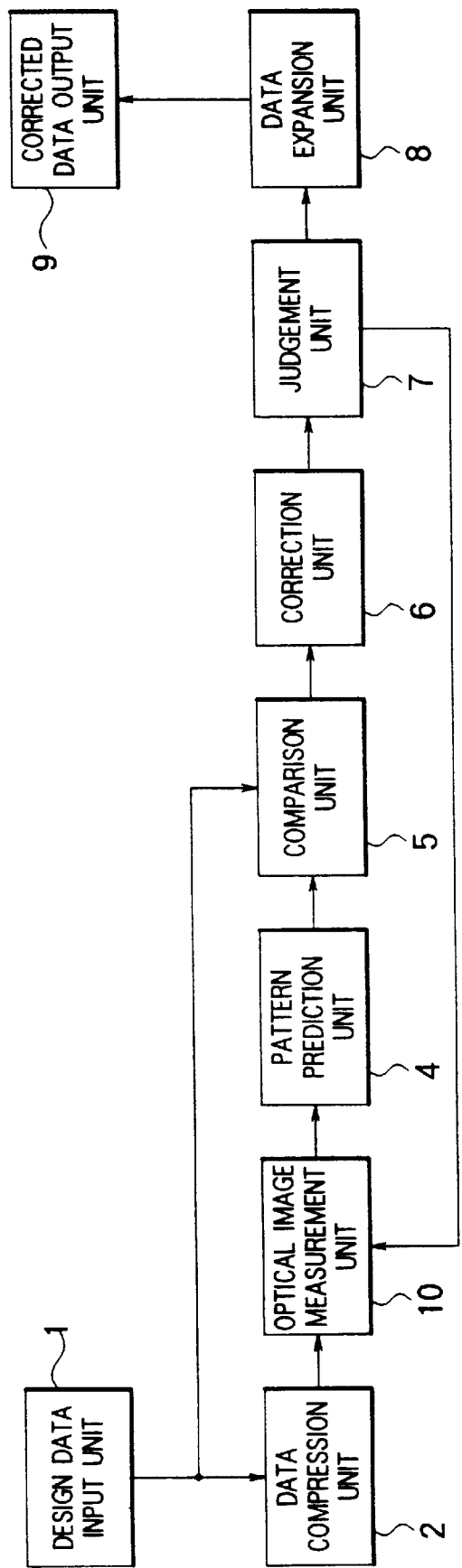
FIG. 4 is a block diagram of a light proximity correction system according to a third embodiment of the present invention.
Figure 5:
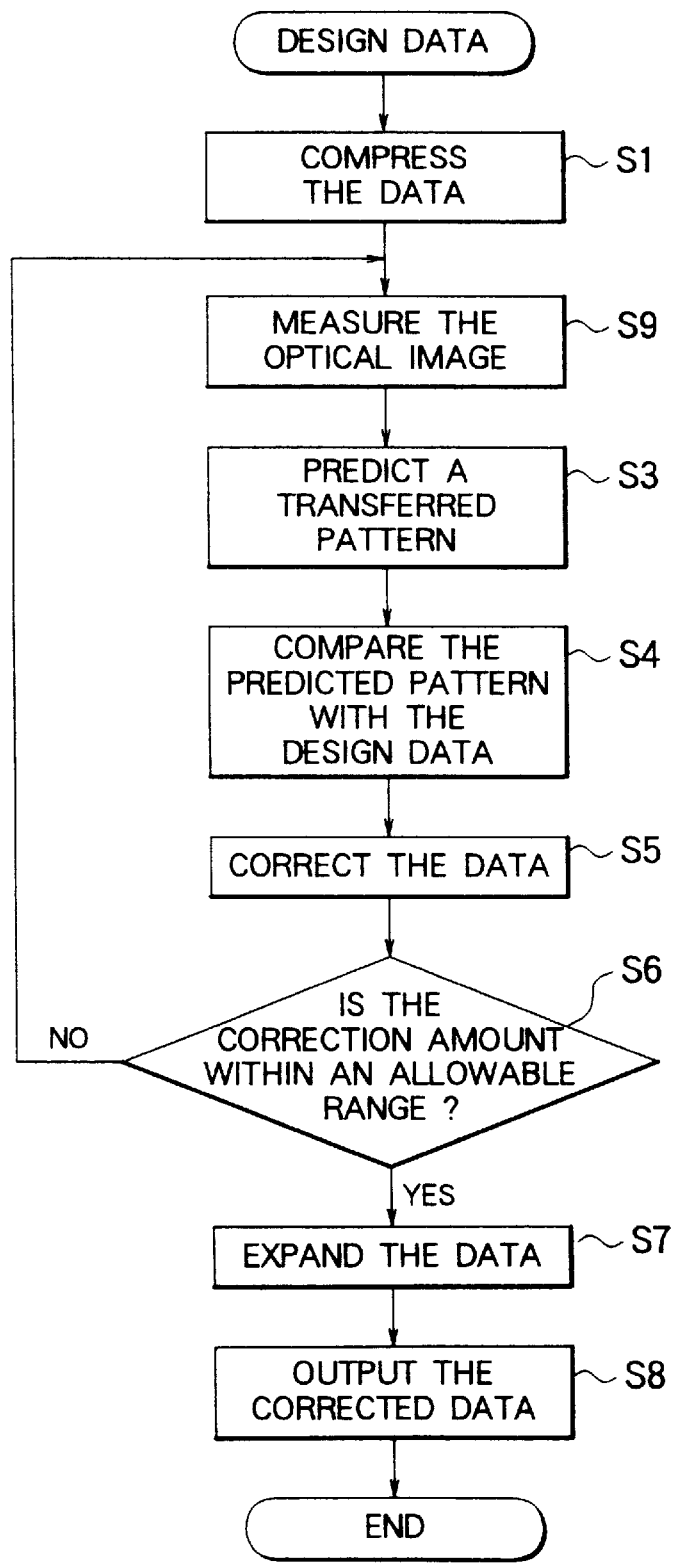
FIG. 5 is a flow chart illustrating an operation relating to the third embodiment of the present invention.

FIG. 4 is a block diagram of a light proximity correction system according to a third embodiment of the present invention. This system according to the third embodiment is the same as that according to the first embodiment shown in FIG. 2 except that the optical image calculation unit 3 is replaced by an optical image measurement unit 10 serving as the optical image formation unit defined in the first aspect of the invention. The optical image measurement unit 10 includes an optical system for measuring the image projected onto a wafer via a mask produced according to the design data. In the case of the second embodiment described above, the pattern image which will be projected onto a wafer is calculated in step S2 by means of software with the optical image calculation unit 3 from the compressed data. In the third embodiment, however, the projected image is measured by means of hardware with the optical image measurement unit 10 in step S9 after the data compression in step S1, as shown in FIG. 5. In FIG. 5, steps S1, S3 to S8 are the same as the corresponding steps of the second embodiment.

The optical system of the optical image measurement unit 10 is constructed so that the requirements described below are satisfied:

$\lambda 1 = \lambda 2$ ; $\sigma 1 = \sigma 2$; $m1 \cdot NA1 = m2 \cdot NA2$ where $\lambda 1$, $\sigma 1$, $m1$, and $NA1$ are parameters relating to a stepper (step-and-repeat projection tool) wherein $\lambda 1$ is the wavelength of light, $\sigma 1$ is the spatial coherence, $m1$ is the magnification, and $NA1$ is the numerical aperture, and $\lambda 2$, $\sigma 2$, $m2$, and $NA2$ are parameters relating to the optical system of the optical image measurement unit 10 wherein 12 is the wavelength of light, $\sigma 2$ is the spatial coherence, $m2$ is the magnification, and $NA2$ is the numerical aperture. The employment of such an optical system allows high accuracy measurement of the diffraction effects of light arising in the pattern transfer process and it is possible to reduce the time required to perform the correction process.

EMBODIMENT 4

Figure 6:
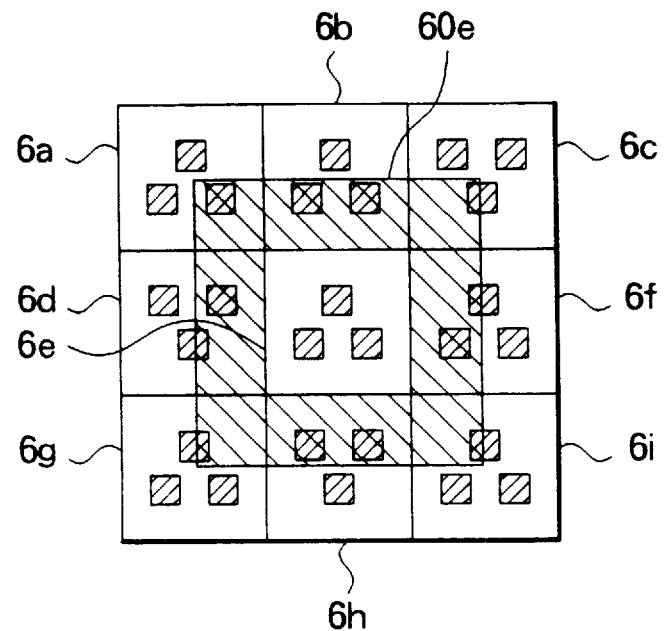
FIGS. 6, 7A, and 7B are schematic representations of correction methods according 8B, 9A, 9B, 10A, 10B, 10C, 11, 12A, 12B, 13A, and fourth and fifth embodiments, respectively, of the present invention.

In the data compression process in the second or third embodiment, the data compression unit 2 may divide the design data into a plurality of data blocks 6a to 6i as shown in FIG. 6 so that optical proximity correction is performed separately for each of the data blocks. In the case where the design data is divided into a plurality of data blocks, a buffer area is disposed around each data block so that the influence of pattern elements in neighboring data blocks can be taken into account via the buffer areas in the correction of pattern elements included in each data block. In FIG. 6, for example, there is a buffer area 60e around a data block 6e. It is determined whether the buffer area 60e includes some pattern elements that can have proximity effects on pattern elements in the data block 6. According to the result, it is decided which side of the data block 6e should be corrected. This technique allows each data block to be corrected separately and thus makes it possible to independently perform light proximity correction on a plurality of data blocks at the same time in a parallel fashion thereby reducing the time required for the correction process.

EMBODIMENT 5

Figure 7A:
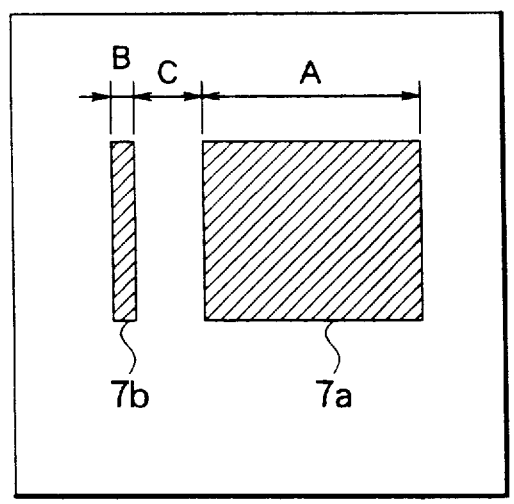
Figure 7B:
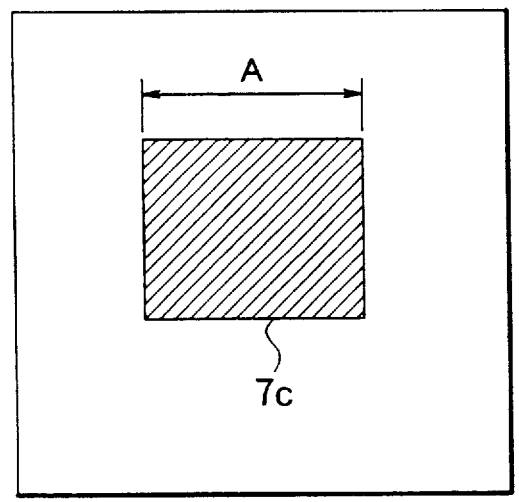

The data compression unit 2 calculates the distance between opposing sides for every pattern element in each data block described in the fourth embodiment so as to check whether there is a data block which includes sides the distance between which is less than a predetermined threshold. If it turns out that some data blocks include such sides, then those data blocks are subjected to the correction process whereas data blocks including no such sides are not subjected to the correction process. In the example of a data block shown in FIG. 7A including patterns 7a and 7b, whereas the distance A is large, distances B and C are smaller than the threshold, and thus light proximity correction should be performed on this data block. Therefore, this data block is subjected to the correction process. In contrast, in the case of a data block shown in FIG. 7B, the distance A of a pattern element 7c is long enough and there are no opposite sides located nearer to each other than the threshold, and thus it is concluded that this data block needs no correction. As a result, no correction is performed on this data block. In this embodiment, it is determined whether correction is required for each data block and thus it is possible to reduce the time required for the correction process.

EMBODIMENT 6

Figure 41A:
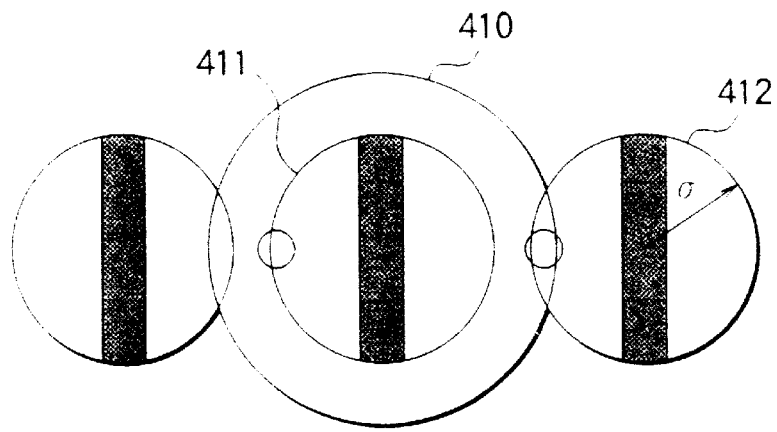
Figure 41B:
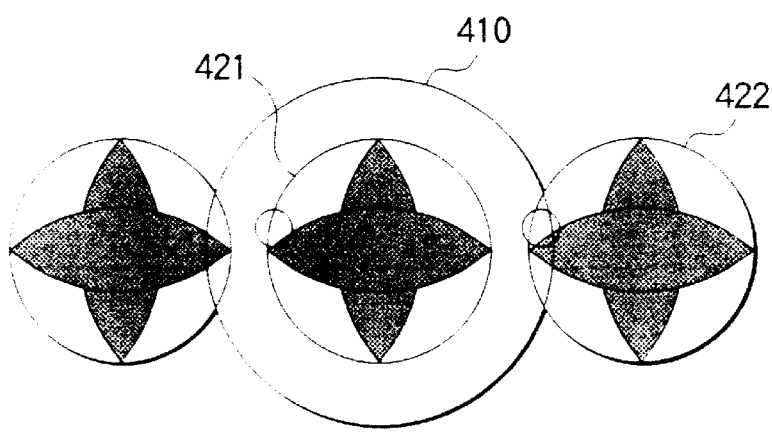

In the case where an exposure system including a variable light source is employed, a light shielding part is disposed in a secondary light source plane and therefore a diffraction image of the light source is formed on the pupil plane of the exposure apparatus. For example, FIG. 41A illustrates a diffraction pattern of a variable light source having a light shielding part in the form of straight lines, and FIG. 41B illustrate a diffraction pattern of a variable light source having a light shielding part in the form of crosses. In FIGS. 41A and 41B, the diffraction patterns are of a zeroth-order light source image 411 or 421 and first-order light source images 412 or 422 formed on the pupil plane 410. These figures describe diffraction patterns under the critical conditions where two-light-ray interference occurs between the zeroth-order light source image 411 or 421 and either one of two first-order light source images 412, 422.

The period L2 corresponding to the cutoff frequency of the two-light-ray interference can be described as follows:

$L2=\lambda/(\sigma+1)NA$ where $\lambda$ is the wavelength of light, $\sigma$ is the spatial coherence, and NA is the numerical aperture. That is, if the size of a pattern is greater than the period L2, then at least two light rays can interfere with each other.

Figure 41C:
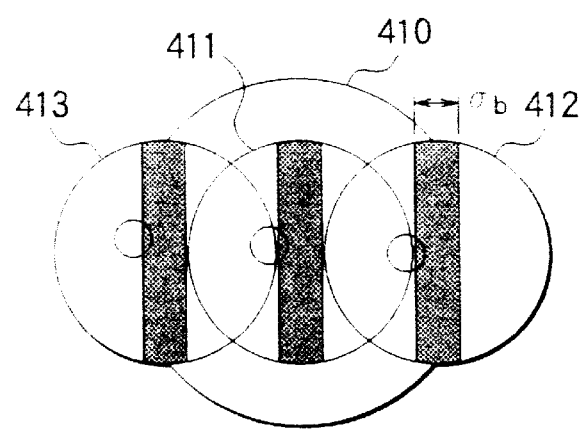
Figure 41D:
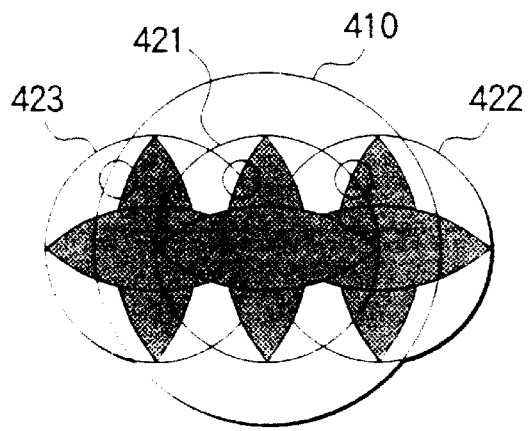

FIGS. 41C and 41D illustrate diffraction patterns of variable light sources having light shielding parts in the forms of straight lines and crosses, respectively, for the cases of critical conditions in which three-light-ray interference occurs among the zeroth-order light source image 411 or 421 and first-order light source images 412 and 413 or 422 and 423 formed on the pupil plane 410. The period L3 corresponding to the cutoff frequency of the three-light-ray interference can be described as follows:

$L3=\lambda/(1-\sigma b)NA$ where $\sigma b$ is the spatial coherence of the light source image associated with the light shielding part. Thus if the pattern size is greater than the period L3, three-light-ray interference occurs.

FIG. 42A illustrates the light proximity effects on the final width of lines having a width of 0.35 μm for various spacing widths when a normal light source is used, and FIG. 42B illustrates the light proximity effects on the finally-obtained width of spaces having a width of 0.35 μm for various line widths. In FIGS. 42A and 42B, "small" denotes a pattern having a size smaller than the period L2. The conditions are adjusted using a "small" pattern so that the finally-obtained line and space widths of such small patterns are maintained unchanged without being influenced by the light proximity effects. The "middle" pattern refers to a pattern having a size in the range from the period L2 to L3, and the "large" pattern refers to a pattern having a size greater than the period L3. In the cases of these patterns, the finally-obtained line and space widths become different from the design values. Therefore, light proximity correction is required for the conditions where the line or space width is equal to the "middle" or "large" pattern, as represented by symbols X in FIG. 44A.

FIGS. 43A and 43B illustrate light proximity effects for cases where a variable light source is used. Also in these cases, "small", "middle", and "large" patterns refer to those patterns having sizes less than the period L2, in the range from the period L2 to L3, and greater than the period L3, respectively, as in the case of the normal light source The conditions are also adjusted using a "small" pattern so that the finally-obtained line and space widths of such small patterns are maintained unchanged without being influenced by the light proximity effects. In the variable light source, as can be seen from FIG. 43A, the finally-obtained width of lines with spaces corresponding to the "middle" pattern which can have two-light-ray interference are also maintained unchanged without being influenced by the light proximity effects. However, the final widths of patterns having other sizes deviate from the design values. Thus, the light proximity correction is required when the line width is equal to that of the "middle" or "large" pattern, and the space width is equal to that of the "large" pattern whereas the light proximity correction is not required when the space width is equal to that of the "middle" pattern, as represented by symbols ○ in FIG. 44B.

Therefore, when a variable light source is employed, light-masking patterns having a size less than the period L3 corresponding to the cutoff frequency of the three-light-ray interference may be considered to require no correction in the data compression process.

Furthermore, the finally-obtained widths of lines with spaces corresponding to the "large" pattern have a substantially constant deviation as shown in FIG. 43A. As a result, when those patterns having a size less than a value defining a threshold requiring the light proximity correction, and the opposite sides are located at an interval greater than the period L3 corresponding to the three-light-ray interference cutoff frequency, correction for these patterns can be easily performed simply by adding a constant correction value to the pattern sizes.

EMBODIMENT 7

Figure 8A:
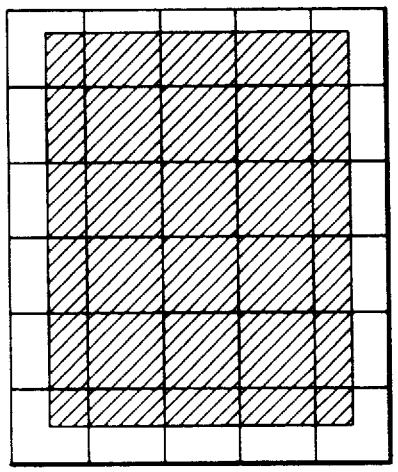
FIGS. 8A to 13B are schematic representations of correction methods according to seventh to twelfth embodiments, respectively, of the present invention.
Figure 8B:
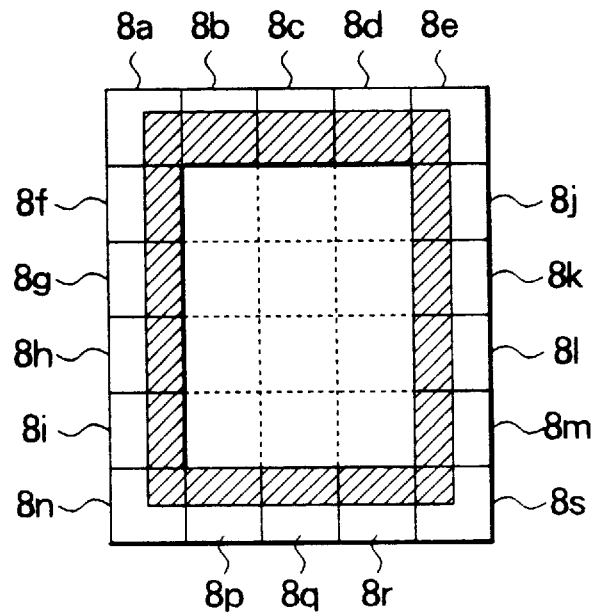

In the data compression process, if a pattern element has a large size lying across a plurality of data blocks as shown in FIG. 8A, only those data blocks including a part of a side of the pattern element are subjected to the correction process. Those data blocks including no side of the pattern element are not subjected to the correction process because light proximity effects cannot occur in such data blocks which have no side. Thus, those data blocks which require no correction can be skipped in the correction process. As a result, a great reduction in the correction time is achieved.

EMBODIMENT 8

Figure 9A:
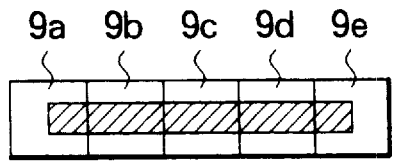
Figure 9A:
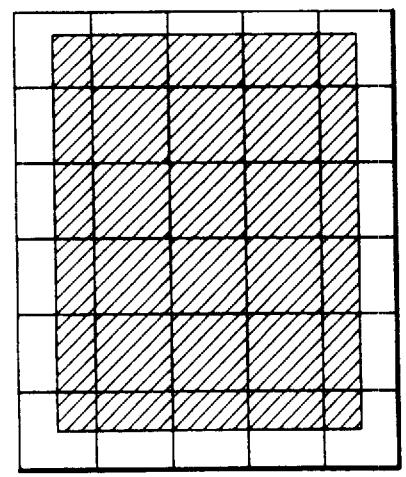
Figure 9B:
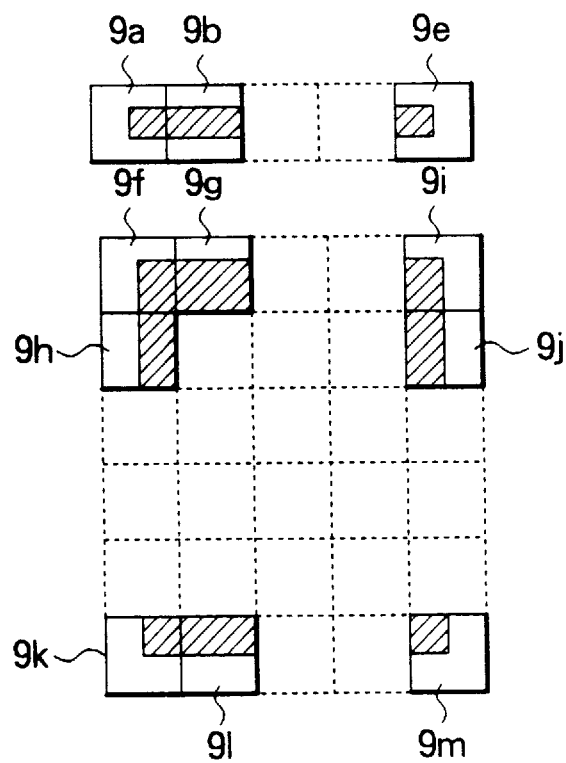

In the data compression process, if a plurality of data blocks include an identical pattern element, only one of them is subjected to the correction process, and the others are skipped in the correction process. For example, in the example shown at the top of FIG. 9A, a rectangle extends in a horizontal direction across data blocks 9a to 9e, and the blocks 9b, 9c, and 9d include a pattern element identical to each other. In this case, as shown in FIG. 9B, only the data block 9b of the data blocks 9b to 9d is subjected to the correction process. After the completion of the correction process, the correction result is applied to data blocks 9c and 9d. Thus, in this embodiment, when a pattern such as that shown in FIG. 9A is given, it is required to correct only the data blocks 9a, 9b, and 9e–9m.

As a result, the time required for the correction process can be reduced.

EMBODIMENT 9

Figures 10A, 10B, 10C:
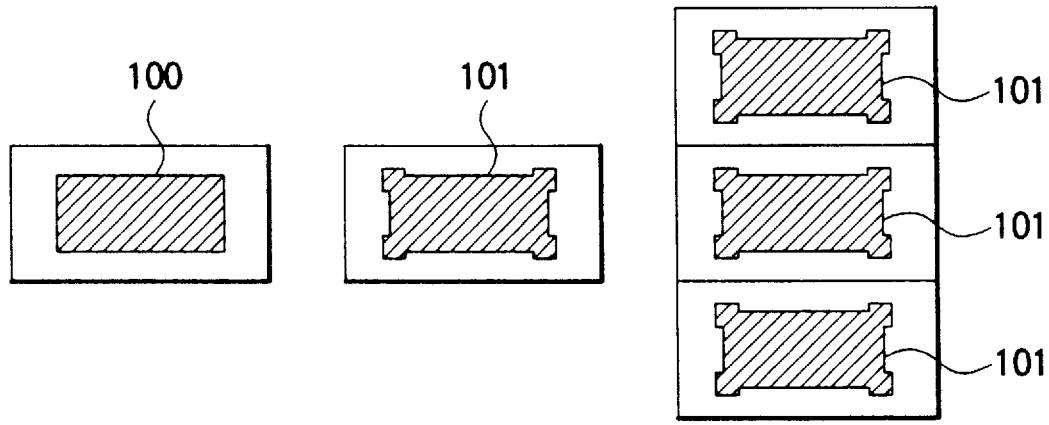

In the data compression process, if a pattern to be processed includes an array consisting of a plurality of identical cells arranged side by side, one cell, for example a cell 100 shown in FIG. 10A, selected from the array is first subjected to a light proximity correction process so that a corrected pattern 101 is obtained as shown in Figure 10B, and then the corrected pattern is expanded into an array form in such a manner as shown in FIG. 10C. This technique makes it possible to reduce the time required for the correction process.

EMBODIMENT 10

Figure 11:
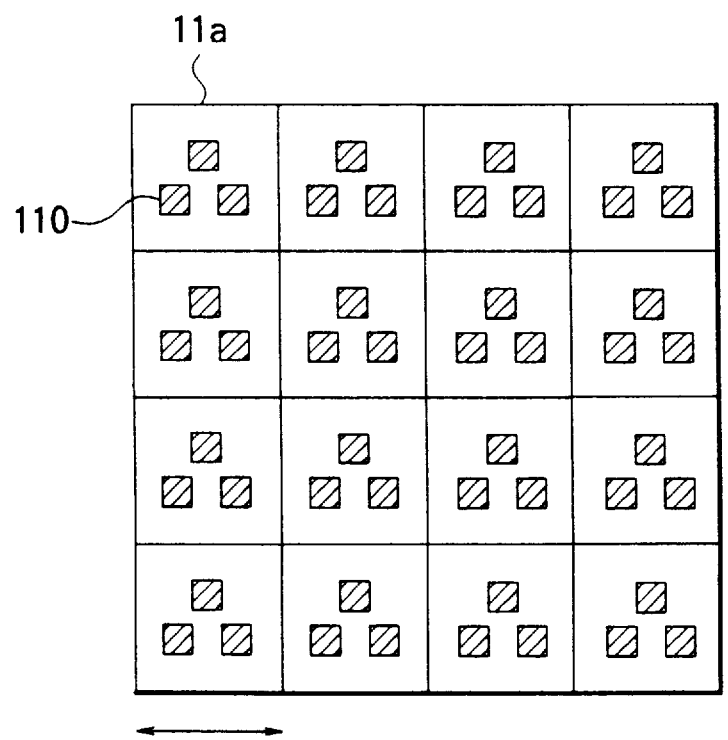

When the pattern to be processed is a memory cell array consisting of a memory cell pattern 110 arranged in a periodic fashion as shown in FIG. 11, the pattern is divided into data blocks 11a in the data compression process in such a manner that the divided blocks 11a have a period corresponding to the period of the memory cell pattern. This allows use of periodic boundary conditions and thus there is no need to use buffer areas as opposed to the embodiment described in connection with FIG. 6. Furthermore, the period allows effective use of fast Fourier transformation (FFT) and thus a further reduction in the processing time can be achieved.

EMBODIMENT 11

Figure 12A:
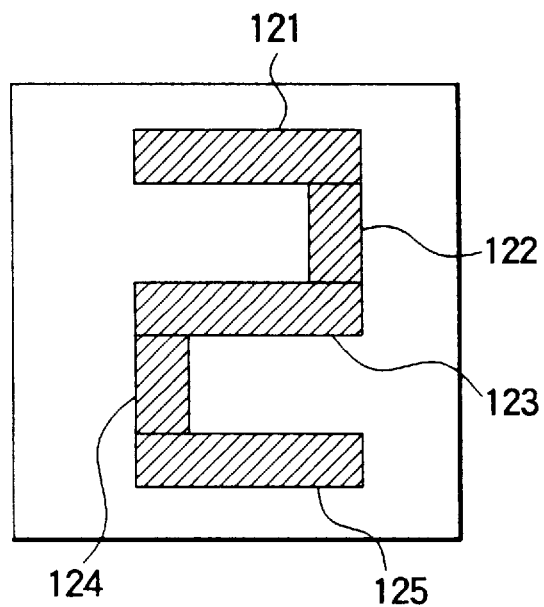
Figure 12B:
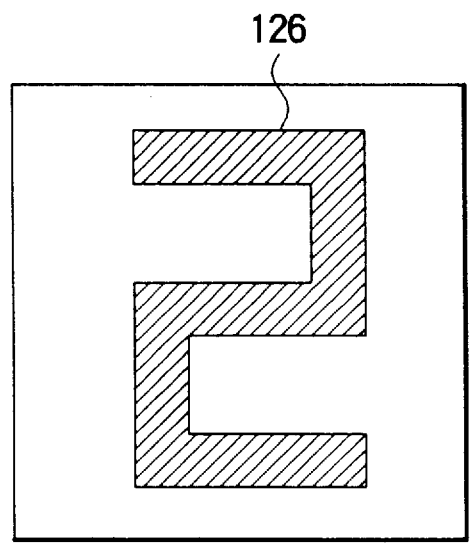

In the case where a data block includes a plurality of pattern elements 121 to 125 lying adjacent to each other as shown in FIG. 12A, these pattern elements 121 to 125 are combined into one pattern element in the form of a polygon 126 in the data compression process, as shown in FIG. 12B. This allows the data to be compressed more effectively so that redundant sides included in a pattern are removed and thus redundant correction processes are prevented.

EMBODIMENT 12

Figure 13A:
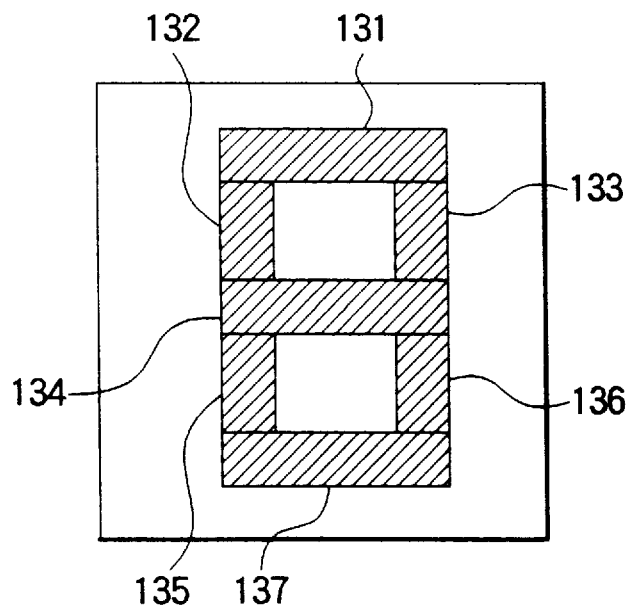
Figure 13B:
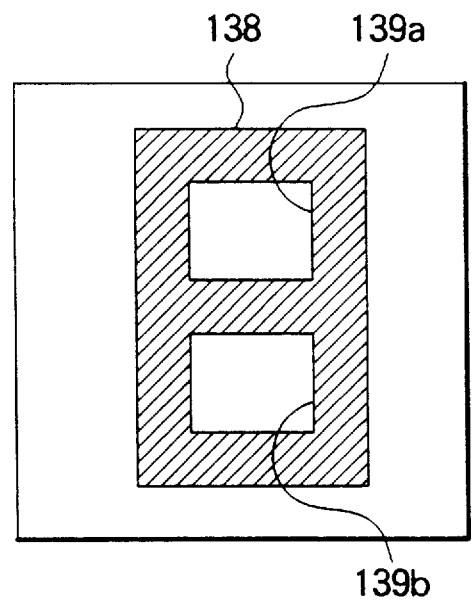

In the case where a data block includes a plurality of pattern elements 131 to 137 surrounding a space pattern as shown in FIG. 13A, the data compression process describes the pattern using a pattern element 138 which defines the outer periphery of the whole pattern including the pattern elements 131 to 137 and also using pattern elements 139a and 139b which define inner space patterns, as shown in FIG. 13B. This makes it easier to perform the correction process on a pattern including a space pattern inside it.

EMBODIMENT 13

Figure 14:
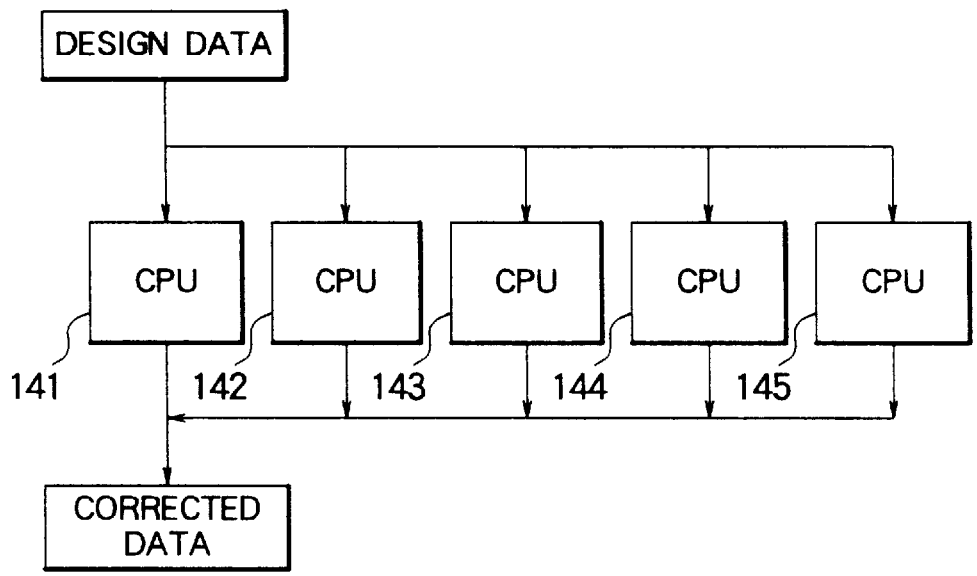
FIGS. 14 and 15 are block diagrams of an optical image calculation unit and an optical image measurement unit, respectively, of a correction system according to a third embodiment of the present invention.

The optical image calculation unit 3 shown in FIG. 2 may be formed with a plurality of CPUs 141 to 145 connected to each other in a parallel fashion as shown in FIG. 14. The design data which has been compressed by the data compression unit 2 is divided into a plurality of portions and each portion is processed in parallel by CPUs 141–145. The calculation results are finally integrated so as to obtain complete correction data. The parallel processing according to the present embodiment results in a great reduction in the time required for the processing. For example, if five CPUs are used as shown in FIG. 14, the processing speed becomes five times faster than that of a system including only one CPU.

Figure 30:
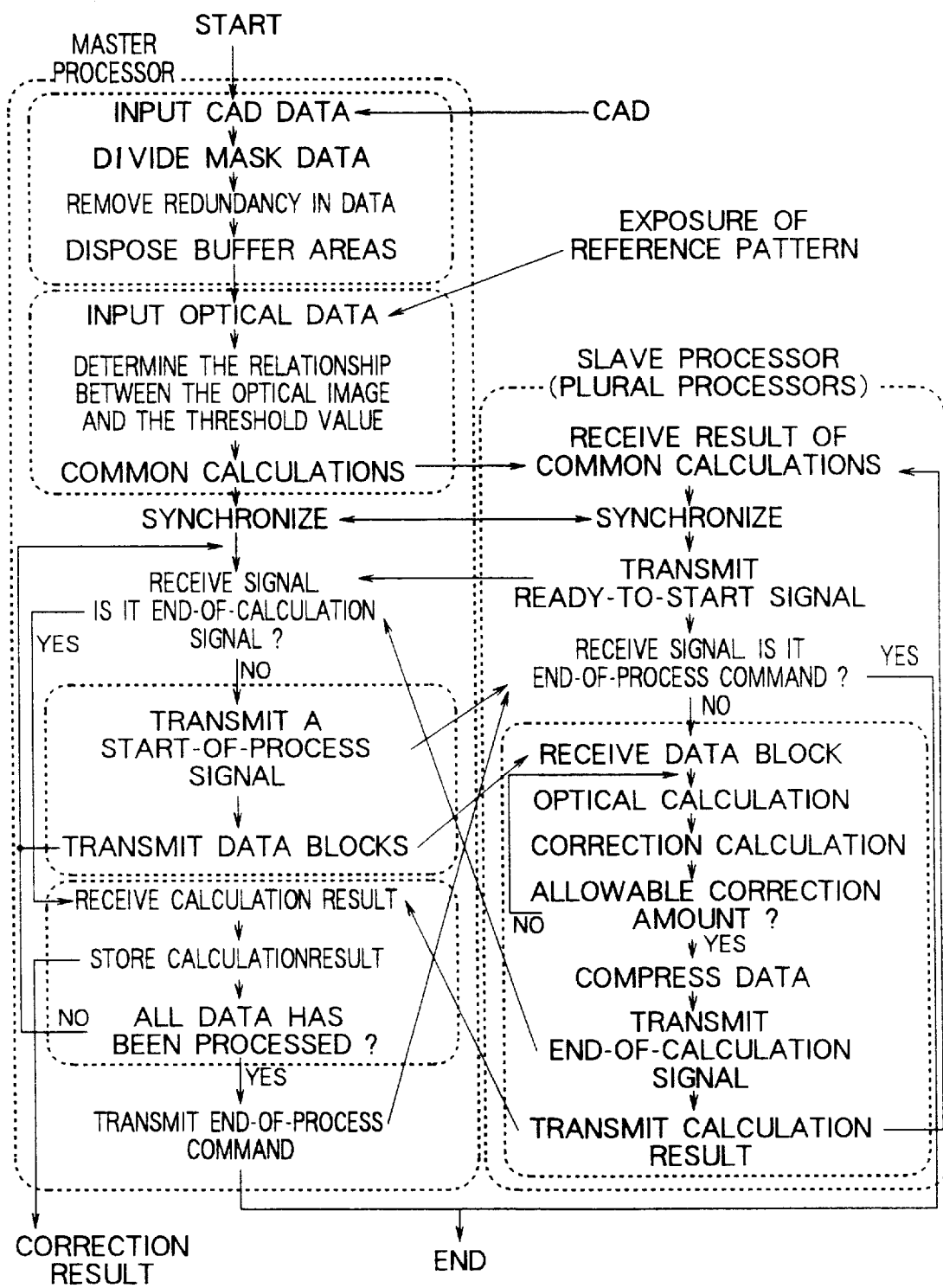
FIG. 30 is a schematic representation of a correction method according to the thirteenth embodiment of the present invention.

Alternatively, the CPU 141 may be used as a master processor which serves as the data compression unit 2, the data expansion unit 8, and the correction data output unit 9 shown in FIG. 2, while the CPUs 142–145 may be used as slave processors which serve as the optical image calculation unit 3, the pattern prediction unit 4, the comparison unit 5, the correction unit 6, and the unit 7 shown in FIG. 2. In this case, the processing is performed according to a procedure shown in FIG. 30. First, CAD data representing a mask pattern is input as design data to the master processor. The master processor divides the received CAD data into a plurality of data blocks and compresses the data of each data block in such a manner that there is no redundancy in the data. The master processor then creates buffer areas around individual data blocks. Then, data representing optical characteristics of an exposure system (not shown) as well as an exposure result of a reference pattern are input to the master processor. From the exposure result of the reference pattern, the master processor determines the relationship between the reference pattern and its optical image. In particular the light intensity threshold is set so that pattern prediction can be properly performed. The master processor also performs calculations which are common for all data blocks, and transmits the calculation results as well as the relationship described above to the plurality of slave processors.

The master processor establishes synchronization with the slave processors and then waits for a signal transmitted by a slave processor. Upon reception of a ready-to-start signal transmitted by a slave processor, the master processor transmits a start-of-process command together with data of a data block to be processed by the slave processor to the slave processor. If the master processor receives an end-of-calculation signal from a slave processor, the master processor receives a calculation result from that slave processor and stores it. When all data has been processed, the master processor sends an end-of-process command to all slave processors so as to complete all processes. On the other hand, if there is still data which has not been processed, the master processor waits for another signal transmitted from a slave processor.

When slave processors receive a start-of-process command and data of an assigned data block from the master processor, the slave processors perform a calculation regarding an optical image and then perform a correction relating to it. If the correction amount falls within the allowable range, then the slave processors compress the corrected data and transmits the calculation results, together with an end-of-calculation signal, to the master processor.

In this embodiment the outermost loop in the flow chart shown in FIG. 3 is performed in parallel by a plurality of slave processors and thus a great reduction in the processing time is achieved.

EMBODIMENT 14

Figure 31:
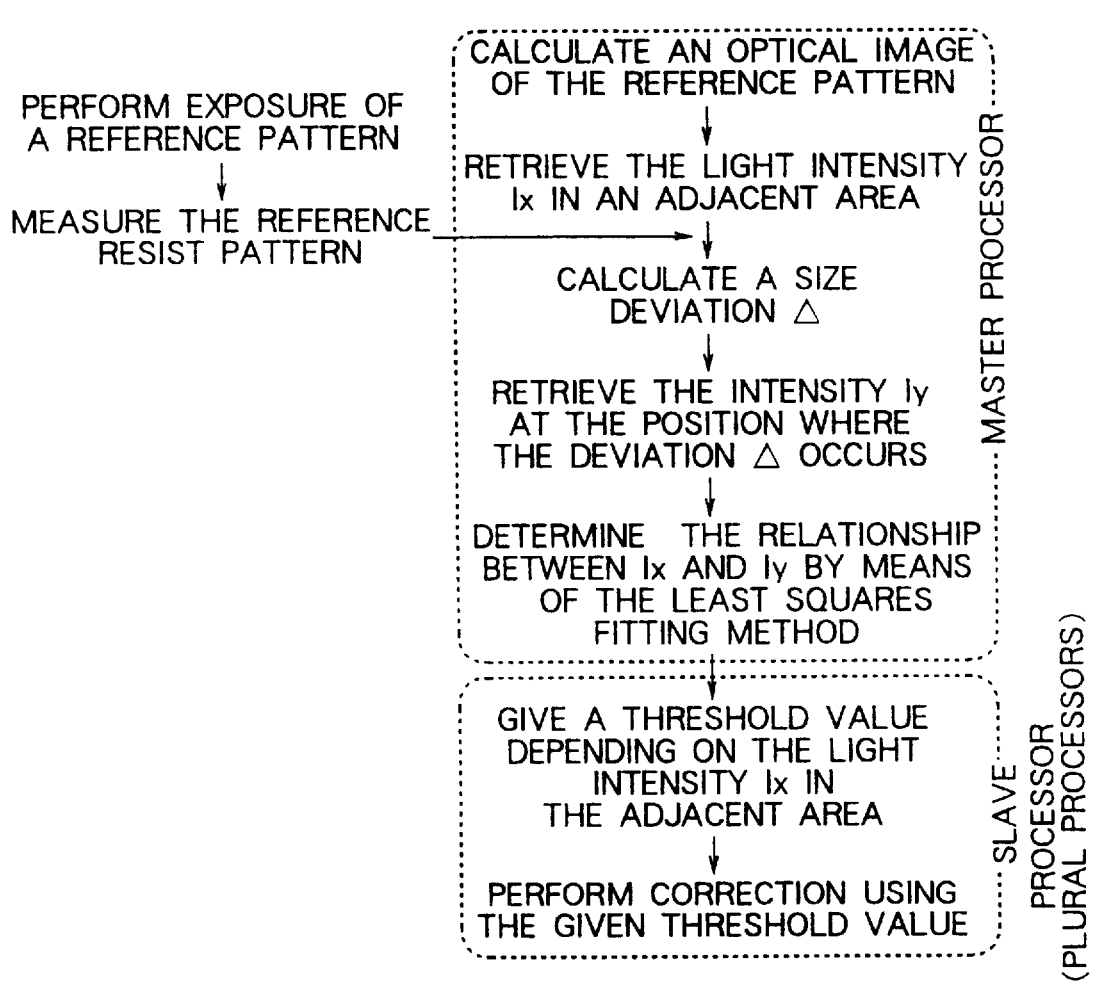
FIG. 31 is a schematic representation of a correction method according to the fourteenth embodiment of the present invention.

In the thirteenth embodiment described above, the relationship between the reference pattern and the optical image thereof may be determined as follows. First, as shown in FIG. 31, the size of a resist pattern which is formed by actually performing exposure of the reference pattern is measured. The master processor calculates the optical image of the reference pattern determined from the reference mask data and retrieves the optical intensity Ix at an edge of the reference pattern. Then, the master processor determines the deviation Δ of the measured size of the resist pattern from the size of the reference pattern, and retrieves the light intensity Iy of the optical image of the reference pattern at the position where the above-described deviation occurs. The master processor further determines the relationship between the light intensities Ix and Iy by means of the least squares fitting method. The slave processors determine threshold values which depend on the light intensities Ix at edges using the relationship determined by the master processor, and perform correction processing using the threshold values.

This technique allows the system to flexibly deal with variations in the resist process for various types of resists. As a result, it is possible to perform high accuracy correction for various resist process conditions and for various types of resists.

Figure 32:
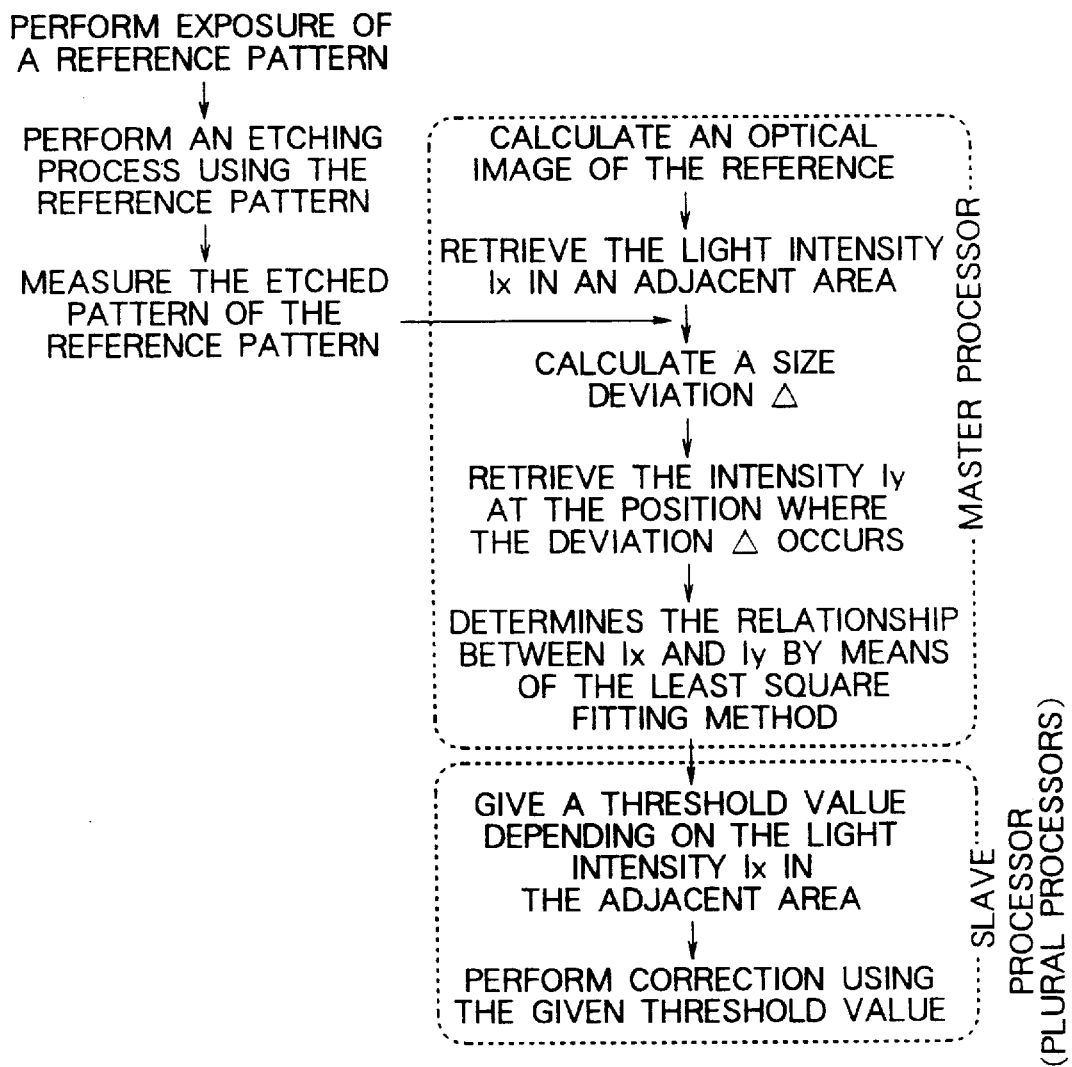
FIG. 32 is a schematic representation of a correction method modified from the fourteenth embodiment of the present invention.

In an alternative mode, the size of the resist pattern may be replaced by the size of the etched pattern formed by an etching process after the exposure of the reference pattern, as shown in FIG. 32. In this case, the variations arising during the etching process may also be incorporated in the correction and thus more precise correction can be achieved.

EMBODIMENT 15

Figure 45:
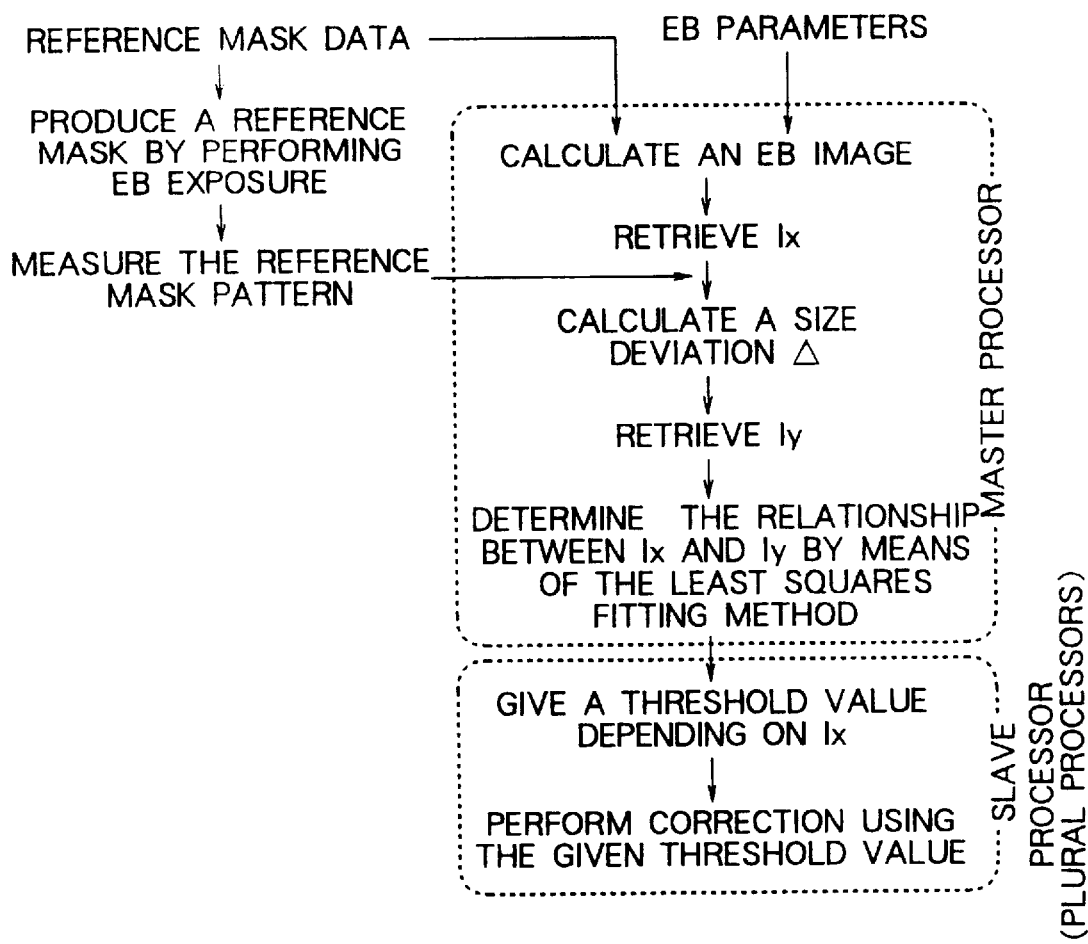
FIG. 45 is a schematic representation of a correction method according to a fifteenth embodiment of the present invention.

In the thirteenth embodiment described above, instead of using the relationship between the reference pattern and the optical image thereof, the relationship between the reference mask data and the produced mask pattern may be used. In this case, as shown in FIG. 45, the reference pattern is first formed by electron beam exposure with the reference mask data, and the size of resultant reference pattern is measured. The master processor calculates an electron beam exposure pattern from the reference mask data and retrieves the electron beam exposure pattern Ix near a mask edge of the electron beam exposure pattern. Then, the master processor determines the deviation $\Delta$ of the measured size of the reference pattern from the size of the electron beam exposure pattern, and retrieves the electron beam exposure pattern Iy at the position where the deviation $\Delta$ occurs. The master processor determines the relationship between Ix and Iy by means of the least squares fitting method. The slave processors determine threshold values, which depend on the electron beam exposure pattern Ix near the edge, using the relationship determined by the master processor, and perform correction processing using the threshold values.

According to the present embodiment, it becomes possible to evaluate only the proximity effect arising when the electron beam exposure of a mask is performed, separately from the other proximity effects, and incorporate this proximity effect in the correction process.

Figure 46:
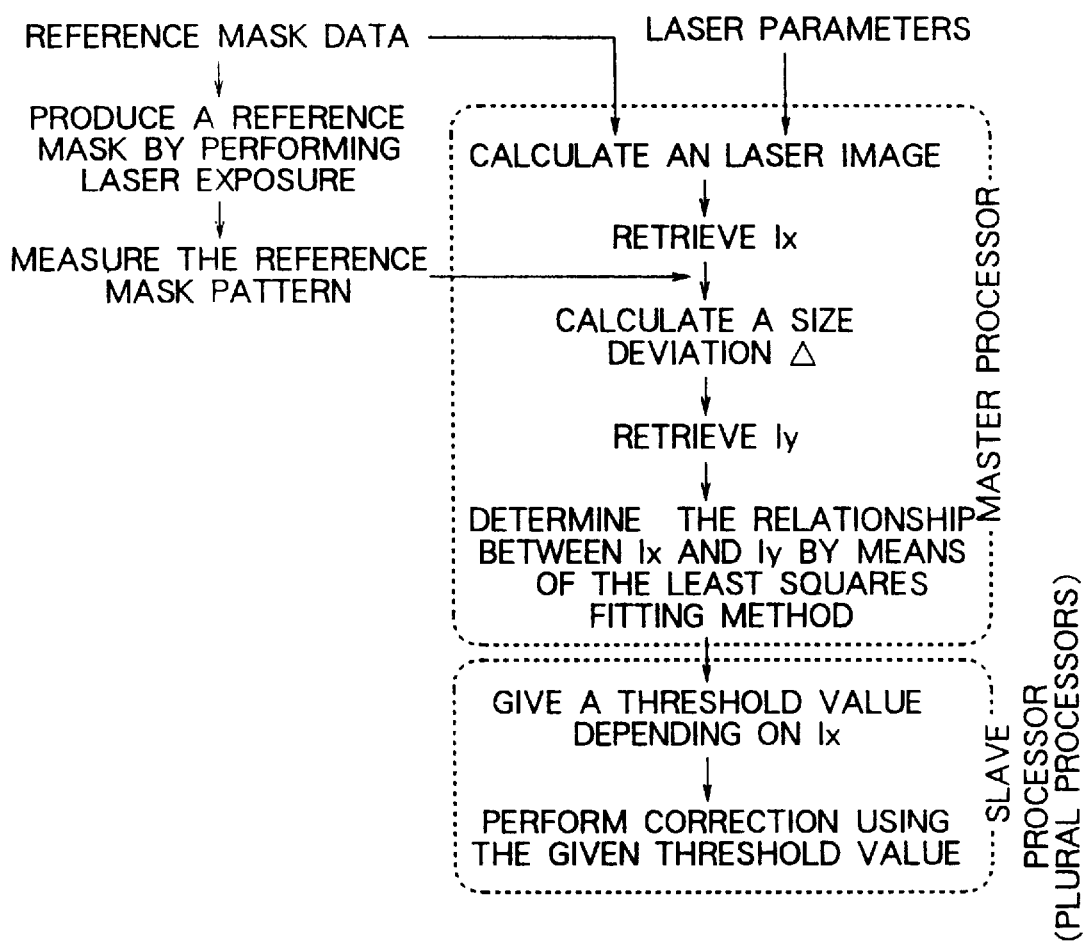
FIG. 46 is a schematic representation of a correction method modified from the fifteenth embodiment of the present invention.

Alternatively, as shown in FIG. 46, the electron beam exposure may be replaced by laser beam exposure. In this case, the relationship between the reference pattern formed by laser beam exposure using the reference mask data and the laser beam exposure pattern calculated from the reference mask data is determined so that only the proximity effect relating to the laser beam exposure of a mask can be evaluated separately from the other proximity effects and it can be incorporated in the correction process.

EMBODIMENT 16

Figure 47:
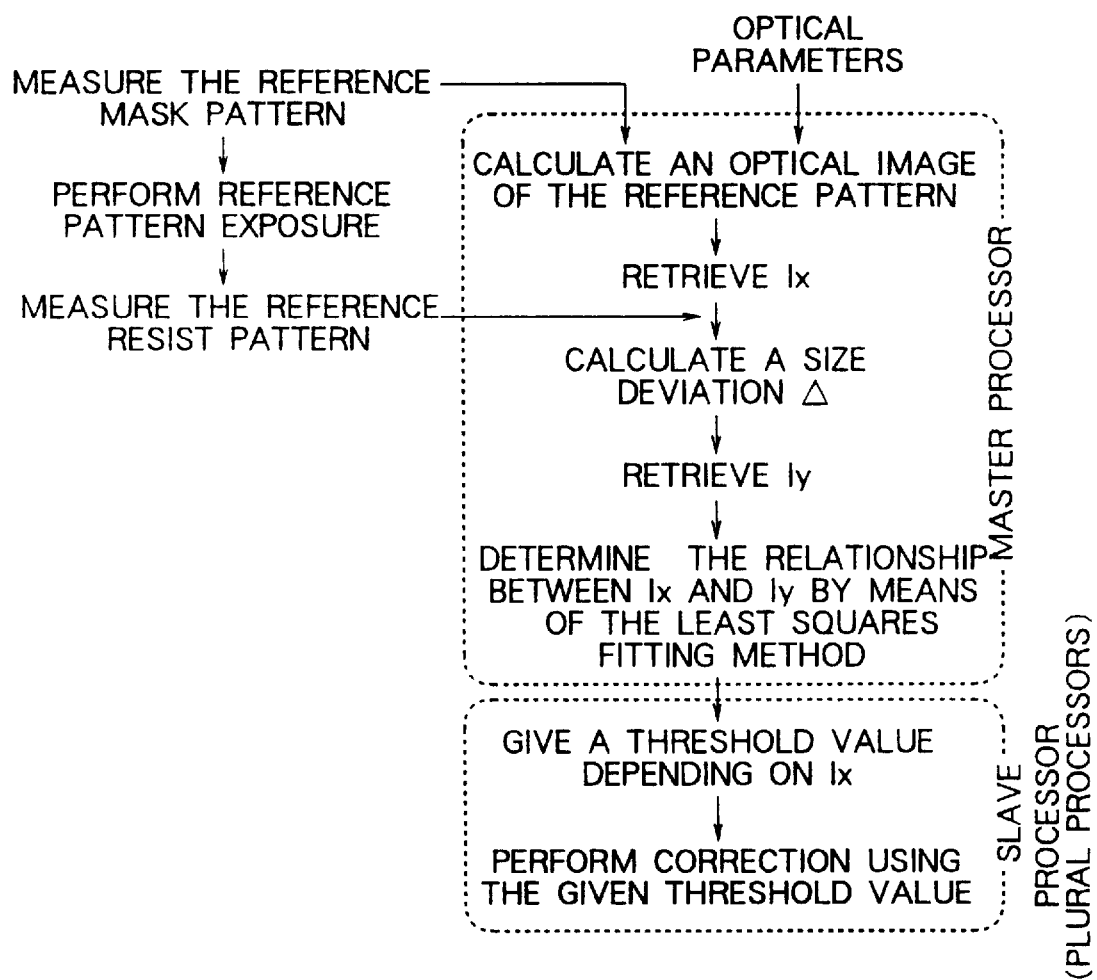
FIGS. 47 and 48 are schematic representations of correction methods according to a sixteenth and seventeenth embodiments, respectively, of the present invention.

In the thirteenth embodiment described above, instead of using the relationship between the reference pattern and the optical image thereof, the relationship between the pattern size of the reference pattern and the size of a resist pattern which is formed by actually exposing a resist to the reference pattern may be used. In this case, as shown in FIG. 47, for example, a reference pattern obtained according to the fifteenth embodiment is used to expose a resist so as to form a resist pattern, and the size of the resultant resist pattern is measured. The master processor calculates an optical image from the pattern size obtained by measuring the reference mask data and retrieves the optical image Ix near a mask edge of the optical image. The master processor determines the difference $\Delta$ between the measured size of the resist pattern and the size of the reference pattern, and then retrieves the optical image Iy at the position at which the difference $\Delta$ occurs. Furthermore, the master processor determines the relationship between Ix and Iy by means of the least squares fitting method. The slave processors determine threshold values, which depend on the optical image Ix in an adjacent area, using the relationship determined by the master processor, and perform correction processing using the threshold values.

In this embodiment, the proximity effect that occurs when a mask pattern is transferred onto a wafer can be evaluated separately from the other proximity effects and this effect can be incorporated in the correction process.

EMBODIMENT 17

Figure 48:
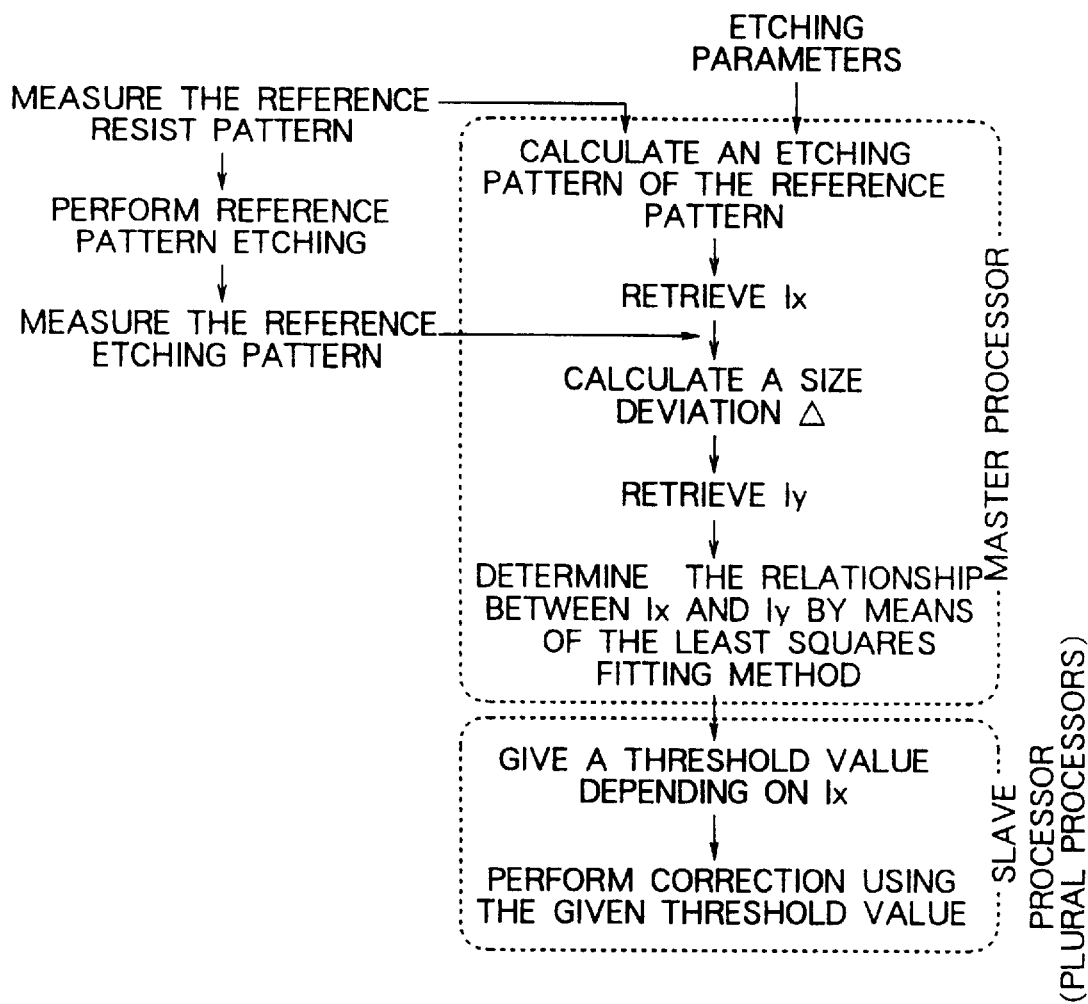

In the thirteenth embodiment described above, instead of using the relationship between the reference pattern and the optical image thereof, the relationship between the size of a resist pattern and the size of an etching pattern formed by performing an etching process using the resist pattern may be used. In this case, as shown in FIG. 48, an etching pattern is formed by actually performing an etching process using a reference resist pattern obtained according to, For example the sixteenth embodiment, and the size of the etching pattern obtained is measured. The master processor calculates an etching pattern from the pattern size obtained by measuring the reference resist pattern, and retrieves the etchant concentration Ix near the resist edge. Then, the master processor determines the deviation $\Delta$ of the measured size of the etching pattern from the size of the reference resist pattern, and retrieves the etchant concentration Iy at the position where the deviation $\Delta$ occurs. The master processor determines the relationship between Ix and Iy by means of the least squares fitting method. The slave processors determine threshold values, which depend on the etchant concentration Ix in an adjacent region, using the relationship determined by the master processor, and perform correction processing using the threshold values.

In this embodiment, the micro loading effect that occurs during an etching process can be evaluated separately from the other effects and this effect can be incorporated in the correction process.

EMBODIMENT 18

Figure 49:
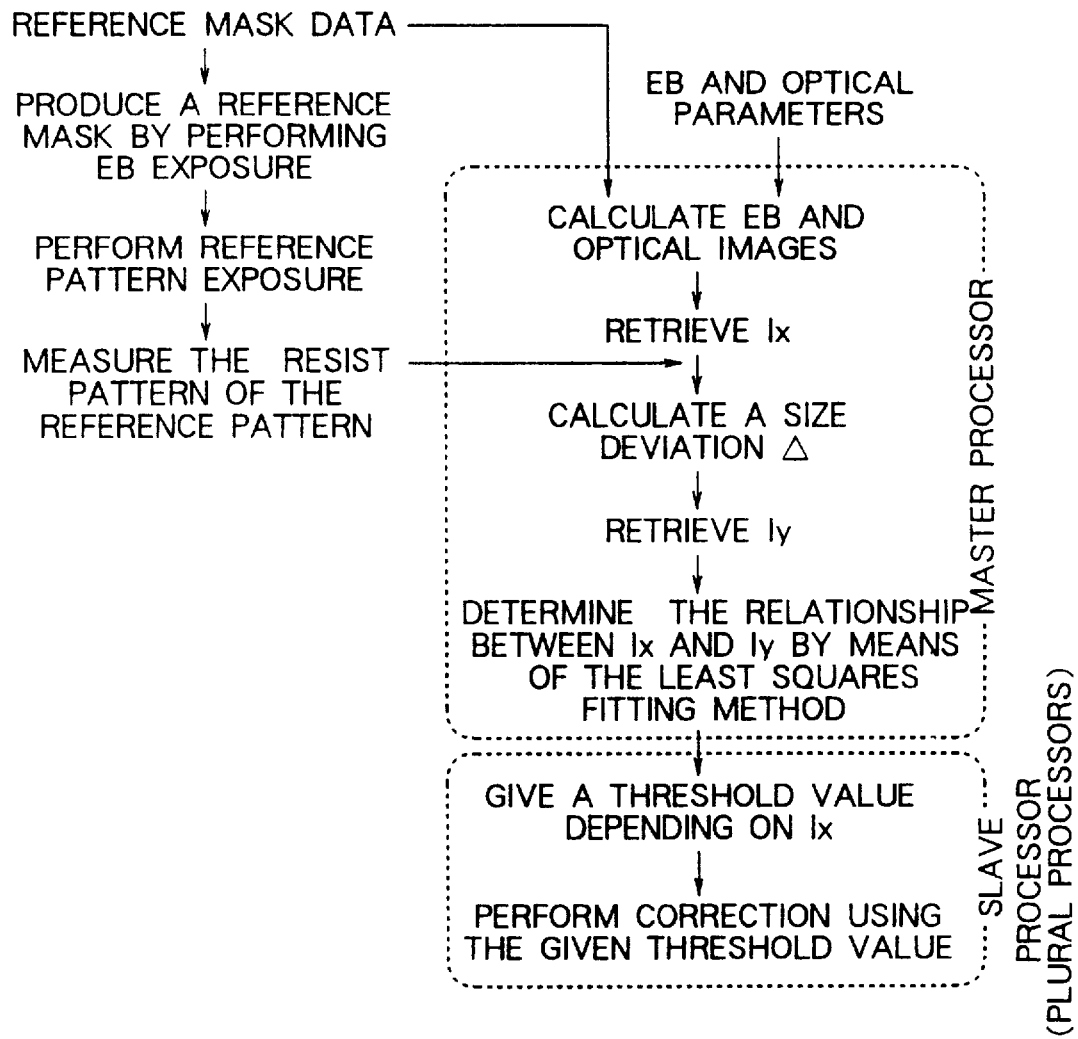
FIG. 49 is a schematic representation of a correction method according to an eighteenth embodiment of the present invention.

In the thirteenth embodiment described above, instead of using the relationship between the reference pattern and the optical image thereof, it is possible to employ the relationship between reference mask data, and a resist pattern obtained by transferring a mask pattern formed by electron beam exposure according to the reference mask data. In this case, as shown in FIG. 49, a reference pattern is formed by actually performing electron beam exposure according to the reference mask data, and a resist pattern is then formed by exposing a resist to the obtained reference pattern. The size of the obtained resist pattern is then measured. The master processor calculates an electron beam exposure pattern from the reference mask data, and further calculates an optical image. Then, the master processor retrieves the optical image Ix near a mask edge of the optical image. The master processor determines the deviation $\Delta$ of the measured size of the resist pattern from the reference mask data, and then retrieves the optical image Iy at the position where the deviation $\Delta$ occurs. The master processor determines the relationship between Ix and Iy by means of the least squares fitting method. The slave processors determine threshold values, which depend on the optical image Ix in an adjacent region, using the relationship determined by the master processor, and perform correction processing using the threshold values.

In this embodiment complex effects of the electron beam proximity effect, which occurs when electron beam exposure is performed according to the reference mask data, and the light proximity effect, which occurs when the mask pattern is transferred onto a wafer by means of optical lithography, can be evaluated, and these effects can be incorporated into the correction process.

Figure 50:
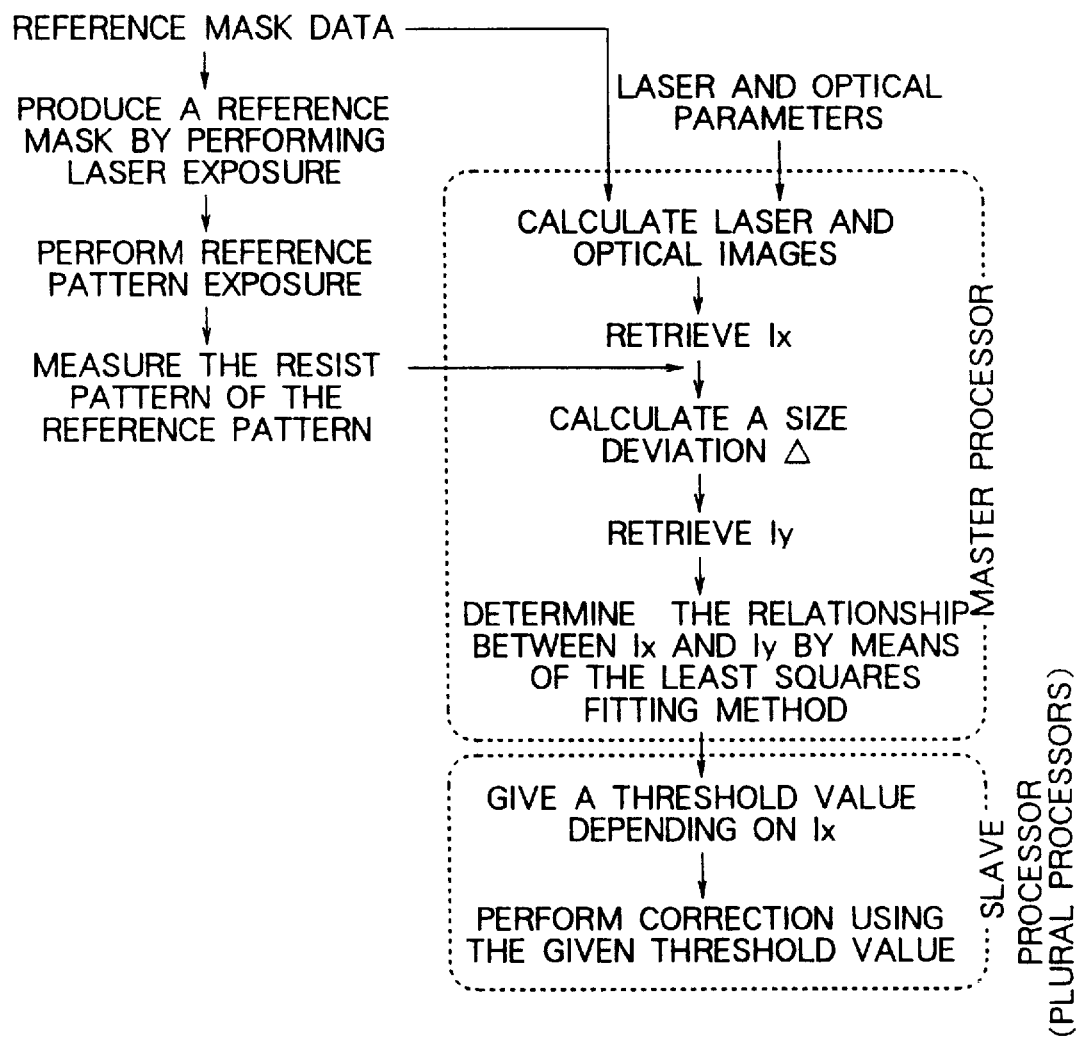
FIG. 50 is a schematic representation of a correction method modified from the eighteenth embodiment of the present invention.

In a modified mode of the present embodiment, as shown in FIG. 50, the electron beam exposure may be replaced by laser beam exposure. In this case, a reference pattern is formed by actually performing laser beam exposure according to the reference mask data, and a resist pattern is then formed by exposing a resist to the obtained reference pattern. Then, the relationship between the resist pattern and an optical image calculated from a laser beam exposure pattern, which is calculated from the reference mask data, is determined. In this modified mode, complex effects of the laser beam proximity effect, which occurs when the laser beam exposure is performed according to the reference mask data, and the light proximity effect, which occurs when the mask pattern is transferred onto a wafer by means of optical lithography, can be evaluated, and these effects can be incorporated into the correction process.

EMBODIMENT 19

Figure 51:
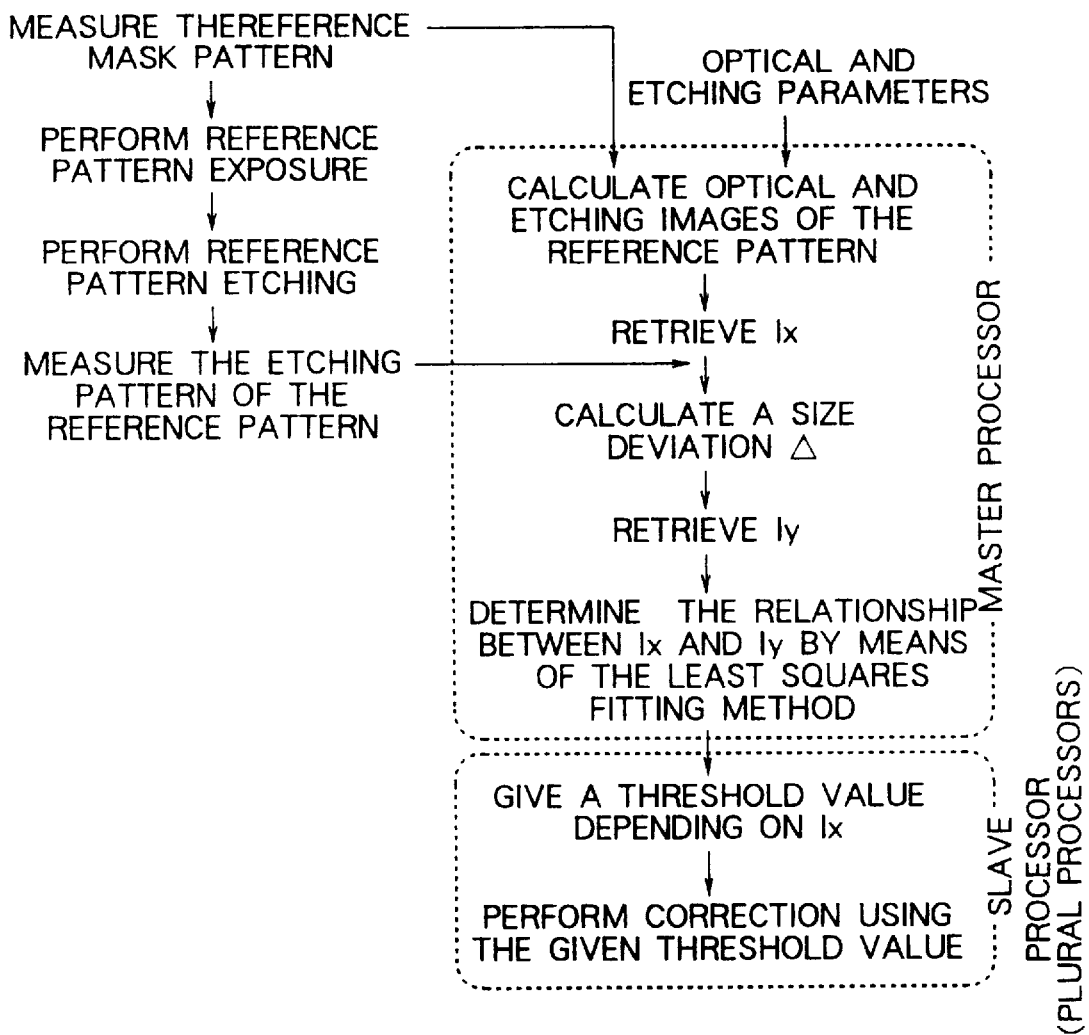
FIG. 51 is a schematic representation of a correction method according to a nineteenth embodiment of the present invention.

In the thirteenth embodiment, instead of using the relationship between the reference pattern and the optical image thereof, the relationship between the size of a reference pattern and the size of an etching pattern formed by performing an etching process using a resist pattern formed by exposing a resist to the reference pattern may be used. In this case, as shown in FIG. 51, a resist pattern is formed by actually exposing a resist to a reference pattern obtained according to, for example, the fifteenth embodiment, and an etching pattern is then formed by performing an etching process using the obtained resist pattern. The pattern size of the resultant etching pattern is then measured. The master processor calculates an optical image from a pattern size obtained by measuring the reference pattern, and further calculates an etching pattern from the optical image. The master processor then retrieves the etchant concentration Ix near a resist edge. The master processor determines the deviation $\Delta$ of the measured size of the etching pattern from the reference pattern, and then retrieves the etchant concentration Iy at the position where the deviation $\Delta$ occurs. The master processor determines the relationship between Ix and Iy by means of the least squares fitting method. The slave processors determine threshold values, which depend on the etchant concentration Ix in an adjacent region, using the relationship determined by the master processor, and perform correction processing using the threshold values.

In this embodiment complex effects of the light proximity effect and the micro loading effect which occur during the optical pattern transferring process and during the etching process can be evaluated, and these effects can be incorporated into the correction process.

EMBODIMENT 20

Figure 52:
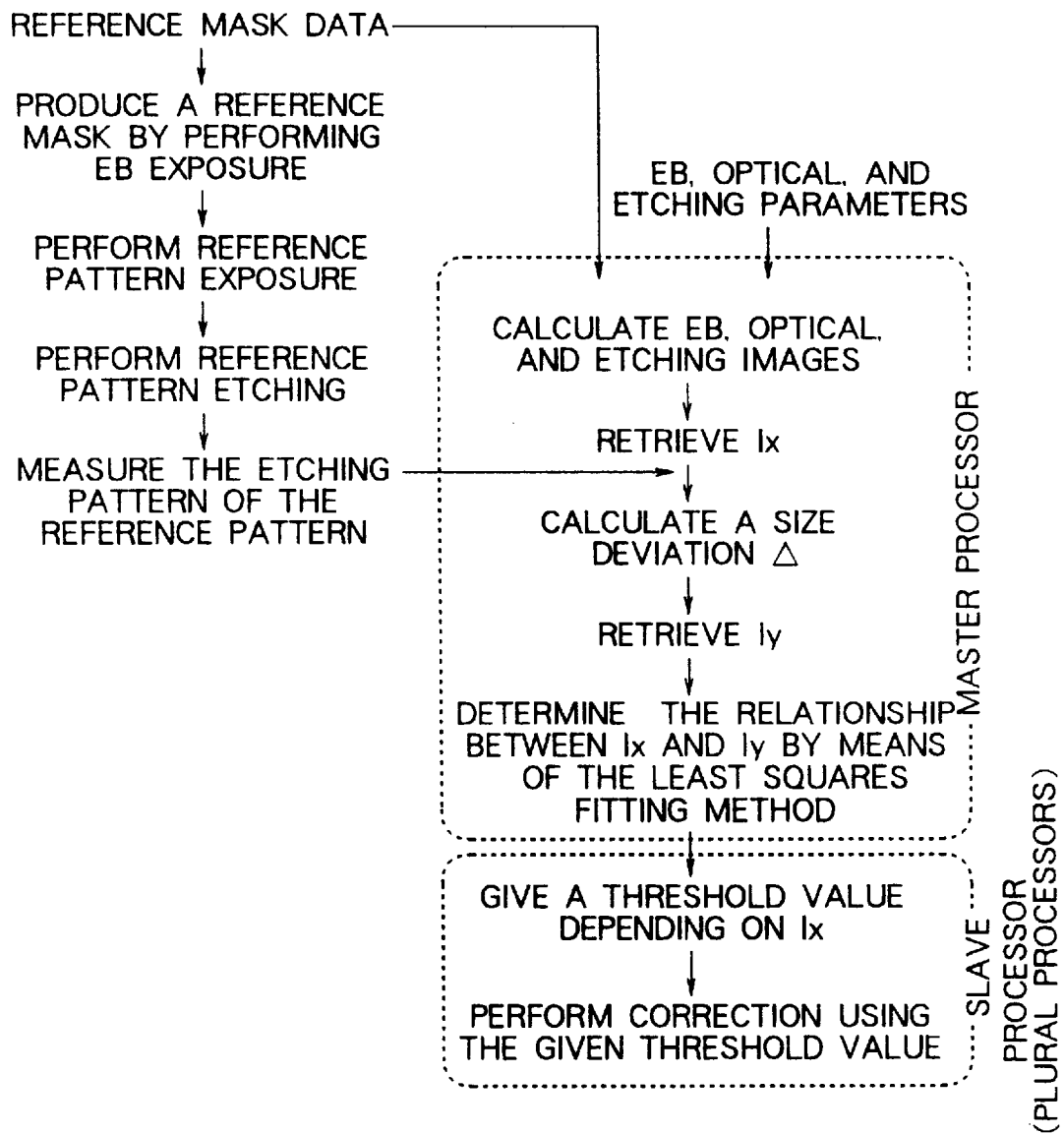
FIG. 52 is a schematic representation of a correction method according to a twentieth embodiment of the present invention.

In the thirteenth embodiment described above, instead of using the relationship between the reference pattern and the optical image thereof, it is also possible to employ the relationship between the reference mask data and an etching pattern obtained by performing an etching process using a resist pattern transferred from a mask pattern formed by performing electron beam exposure according to the reference mask data. In this case, as shown in FIG. 52, a reference pattern is formed by actually performing electron beam exposure according to the reference mask data, and then a resist is exposed to this reference pattern so as to obtain a resist pattern. Furthermore, an etching pattern is formed by performing an etching process using the resist pattern and the size of the resultant etching pattern is measured. The master processor calculates an electron beam exposure pattern from the reference mask data, and further calculates an optical image. Then, the master processor calculates an etching pattern from the optical image. The master processor then retrieves the etchant concentration Ix near a mask edge of the resist pattern. The master processor determines the deviation $\Delta$ of the measured size of the etching pattern from the reference mask data, and then retrieves the etchant concentration Iy at the position where the deviation $\Delta$ occurs. The master processor determines the relationship between Ix and Iy by means of the least squares fitting method. The slave processors determine threshold values, which depend on the etchant concentration Ix in an adjacent region, using the relationship determined by the master processor, and perform correction processing using the threshold values.

In this embodiment it is possible to evaluate complex effects of the electron beam proximity effect, the light proximity effect and the micro loading effect, which occur during the electron beam exposure, optical pattern transferring, and etching processes, and these effects can be incorporated into the correction process.

Figure 53:
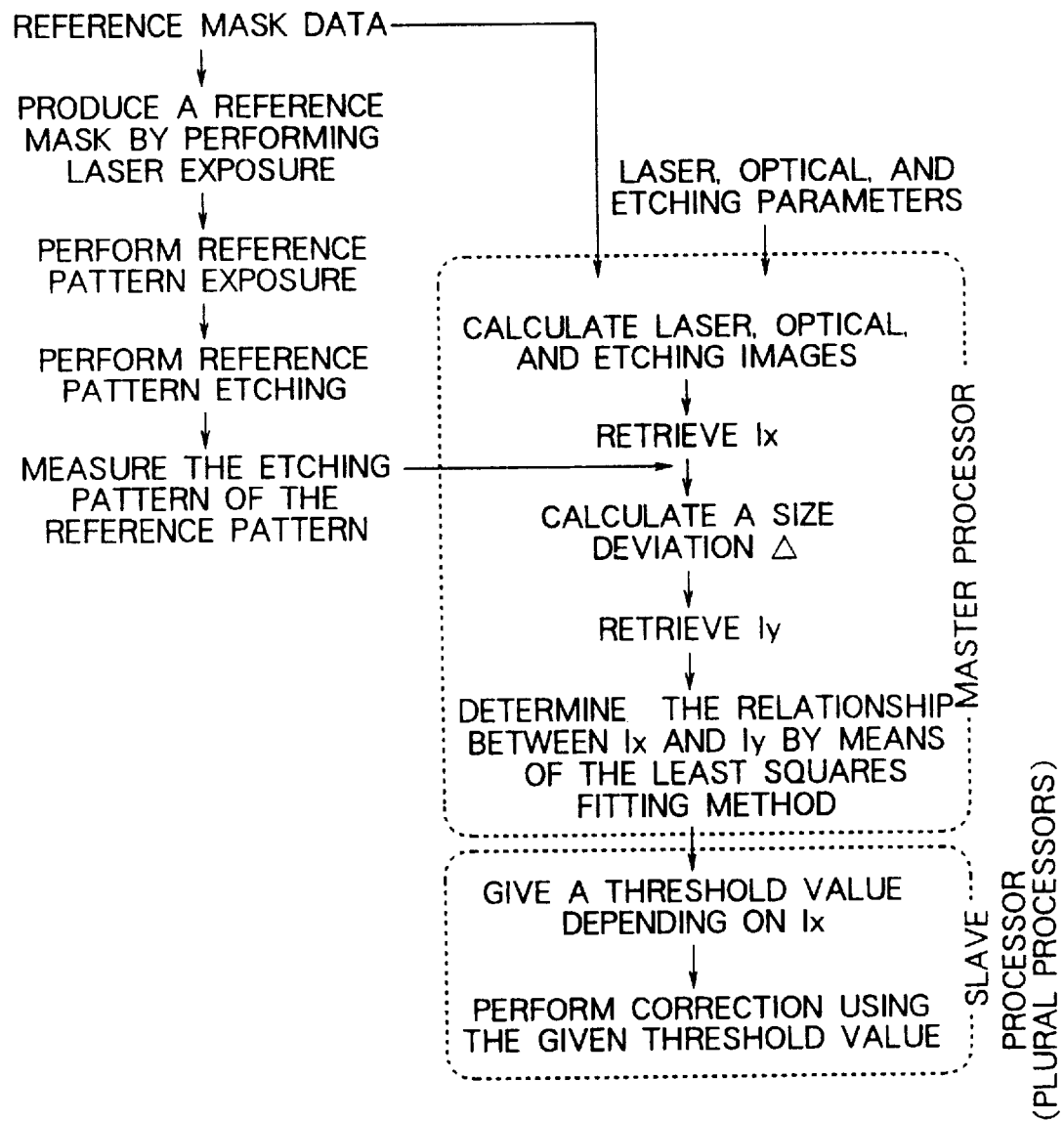
FIG. 53 is a schematic representation of a correction method modified from the twentieth embodiment of the present invention.

Alternatively, as shown in FIG. 53, the electron beam exposure may be replaced by laser beam exposure. In this case, a reference pattern is formed by actually performing laser beam exposure and then a resist is exposed to this reference pattern so as to obtain a resist pattern. Furthermore, an etching pattern is formed by performing an etching process using the resist pattern and the size of the resultant etching pattern is measured. The master processor calculates a laser beam exposure pattern from the reference mask data, and further calculates an optical image. The master processor then calculates an etching pattern from the optical image, and thus the relationship between the calculated etching pattern and the actual etching pattern is determined. In this embodiment, it is possible to evaluate complex effects of the laser beam proximity effect, the light proximity effect and the micro loading effect, which occur during the laser beam exposure, optical pattern transferring, and etching processes, and these effects can be incorporated into the correction process.

EMBODIMENT 21

Figure 15:
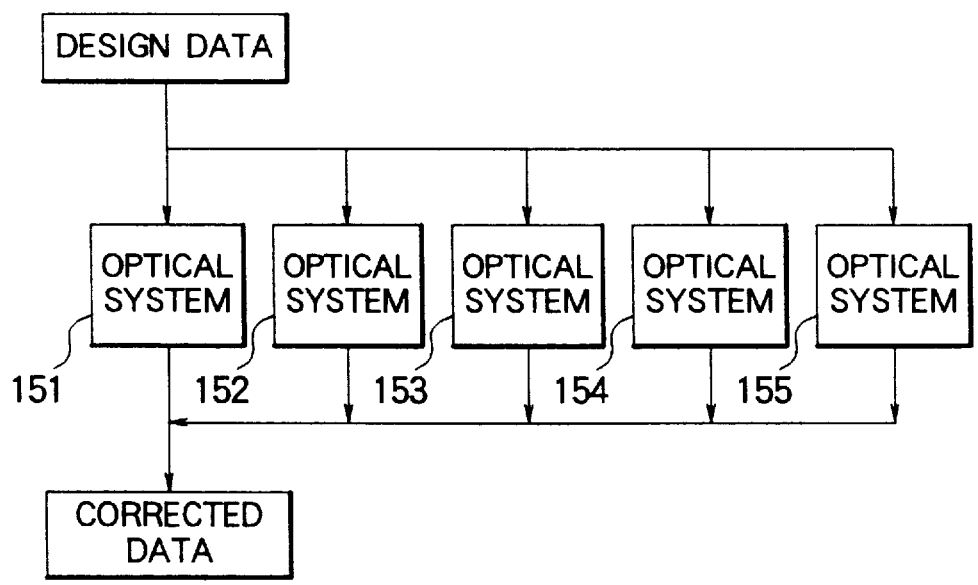

The optical image measurement unit 10 shown in FIG. 4 may be constructed with a plurality of optical systems 151 to 155 as shown in FIG. 15. The design data compressed by the data compression unit 2 is divided into a plurality of data blocks, and these data blocks are measured separately in a parallel fashion by the optical systems 151 to 155. Then, the measured results are combined so as to obtain corrected data. The parallel processing according to this embodiment results in an increase in the processing speed. For example, if five optical systems are used as shown in FIG. 15, the processing speed becomes five times faster than in the case where only one optical system is used.

EMBODIMENT 22

Figure 16:
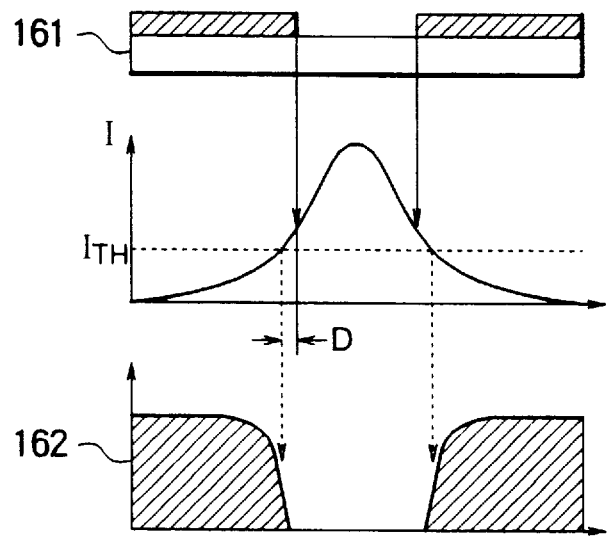
FIG. 16 is a schematic representation of a correction method according to a twenty-second embodiment of the present invention.

In this embodiment, as shown in FIG. 16, a projection image is formed from a mask pattern 161 based on design data, and then, in a transfer pattern prediction process, the pattern prediction unit 4 predicts the mask edge position assuming that the mask edge is located at the position where the light intensity is equal to a predefined threshold $I_{TH}$ and thus predicts the pattern size of a transferred pattern 162 formed in a resist or the like on the surface of a wafer. The correction amount is given by the distance D between the predicted mask edge and the actual mask edge of the mask pattern 161 based on the design data. The threshold $I_{TH}$ is set to a light intensity, which is 0.20 to 0.40 times the light intensity of a flat pattern having no edges. In this embodiment the mask edge is predicted on the basis of the threshold $I_{TH}$ without performing a resist development calculation. This results in a reduction in the processing time.

EMBODIMENT 23

Figure 17A:
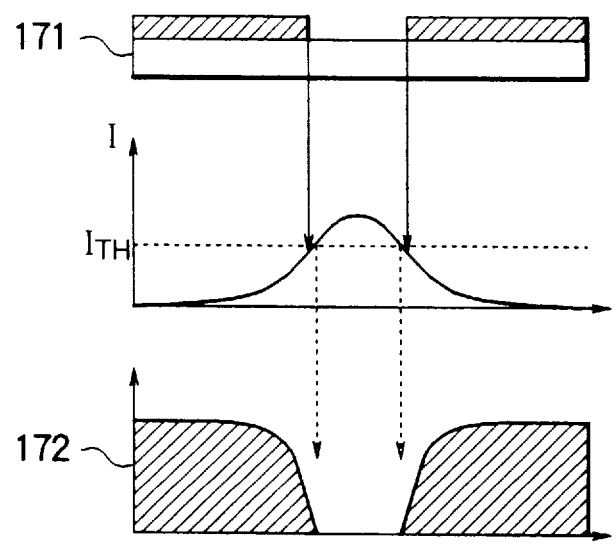
Figure 17B:
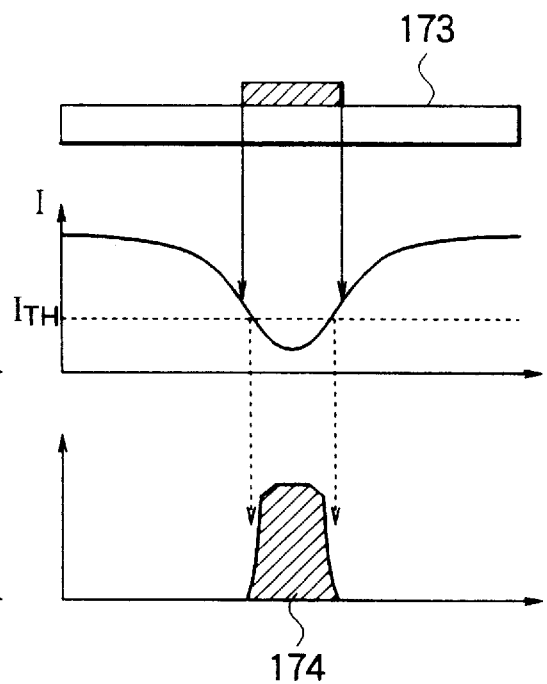

In the previous embodiment 22, the threshold $I_{TH}$ may be adjusted depending on the light intensity in areas near sides of a pattern element to be corrected. For example, a mask pattern 171 shown in FIG. 17A has a narrow light transmission pattern element. Therefore, the light intensity near the sides (edges) to be corrected becomes lower than in the case of a wider light transmission pattern element. In this case, the threshold $I_{TH}$ is set to a higher value. In contrast, when the light transmission part of a pattern element is wide as in mask patterns 173, 181, and 183 shown in FIGS. 17B, 18A, and 18B, respectively, the light intensity near sides (edges) to be corrected is large enough. Therefore, the threshold $I_{TH}$ is set to a lower value in this case. In this embodiment transferred patterns 172, 174, 182, and 184 are predicted taking into account the conditions near the sides to be corrected thereby quickly achieving high accuracy pattern prediction.

EMBODIMENT 24

Figure 33:
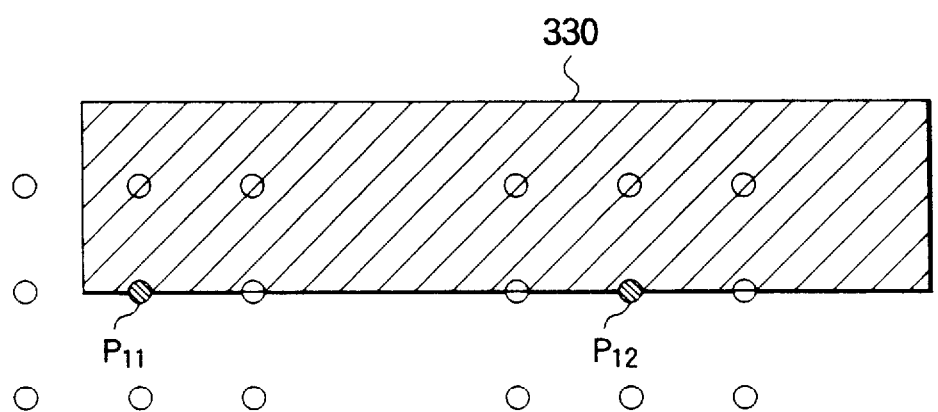
FIGS. 33 and 34 are schematic representations of a correction method according to a twenty-fourth embodiment of the present invention.
Figure 34:
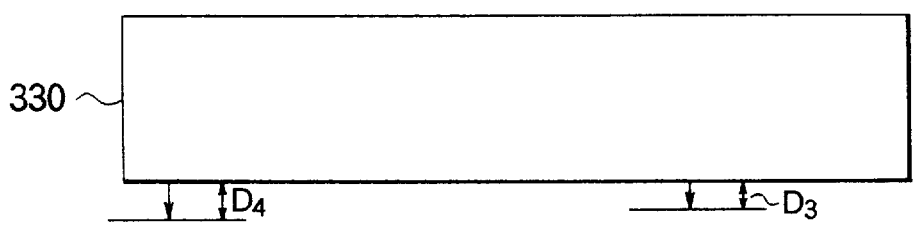

In embodiment 22, the threshold $I_{TH}$ may be adjusted depending on the two-dimensional light intensity distribution near sides to be corrected. For example, when a rectangular pattern such as that shown in FIG. 33 is to be corrected, the light intensity distribution near a point Pa at a corner of the rectangular pattern 330 is different from that near a point Pb on a side. Therefore, the correction amount for the point Pa is different from that for the point Pb. To avoid the above problem, a plurality of monitor points Pm are disposed near the points Pa and Pb whereby two-dimensional light intensity distribution is monitored and it is detected whether the points Pa and Pb are located at a corner or on a side. If it is detected that a point is located at a corner, the correction amount D4 should be greater than the correction amount D3 for a point on a side so as to cancel the effects of etching, development, and the like. Therefore, the threshold $I_{TH}$ is set to a low value in this case. In this embodiment the two-dimensional conditions of a pattern are taken into account in the pattern prediction so that high accuracy pattern prediction is achieved.

EMBODIMENT 25

Figure 35A:
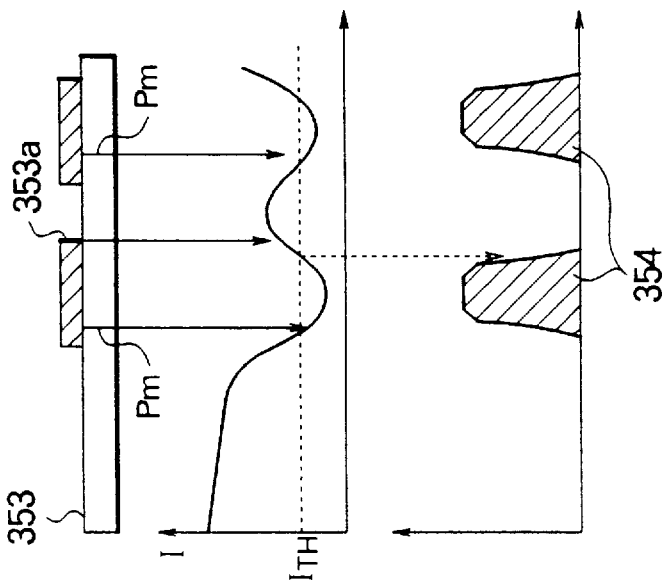
FIGS. 35A, 35B and 36 are schematic representations of correction methods according to twenty-fifth and twenty-sixth embodiments, respectively, of the present invention.
Figure 35B:
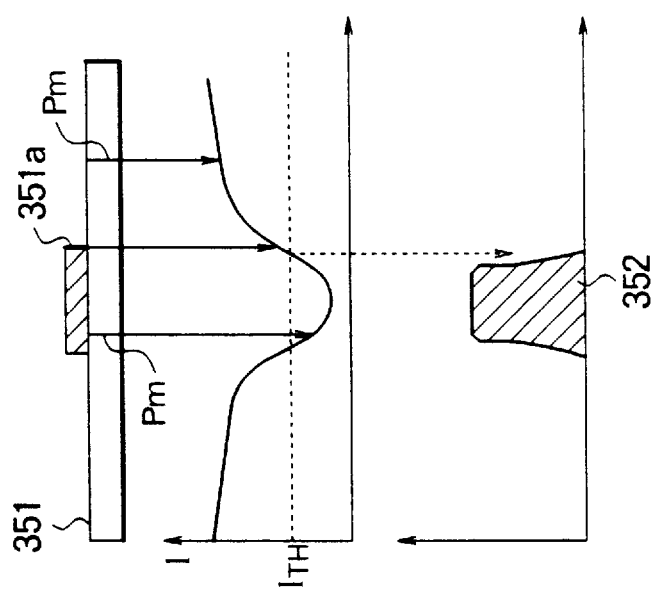

In embodiment 22, the threshold $I_{TH}$ may be adjusted depending on whether there is some pattern element near a side to be corrected. For example, in the case of a mask pattern 351 shown in FIG. 35A, there are no pattern elements near a side 351a to be corrected. In contrast, in the case of a mask pattern 353 shown in FIG. 35B, there is a pattern element near a side 353a to be corrected. In this case, the light intensity in an area on the right of the side 353a becomes lower. To avoid this problem, monitor points Pm are disposed on the right and left of a side of a pattern element to be corrected so as to detect whether there is another pattern element near the side. In the case of the mask pattern 351, the sum of the light intensities a t the right and left monitor points Pm has a large value, and thus it is concluded that there is no pattern element near the side under the consideration and the threshold $I_{TH}$ is set to a large value. On the other hand, in the case of the mask pattern 353, the sum of the light intensities at the right and left monitor points Pm has a small value, and thus it is concluded that there is another pattern element near the side under the consideration and the threshold $I_{Th}$ is set to a small value. This offers further high accuracy in the pattern prediction.

EMBODIMENT 26

Figure 36:
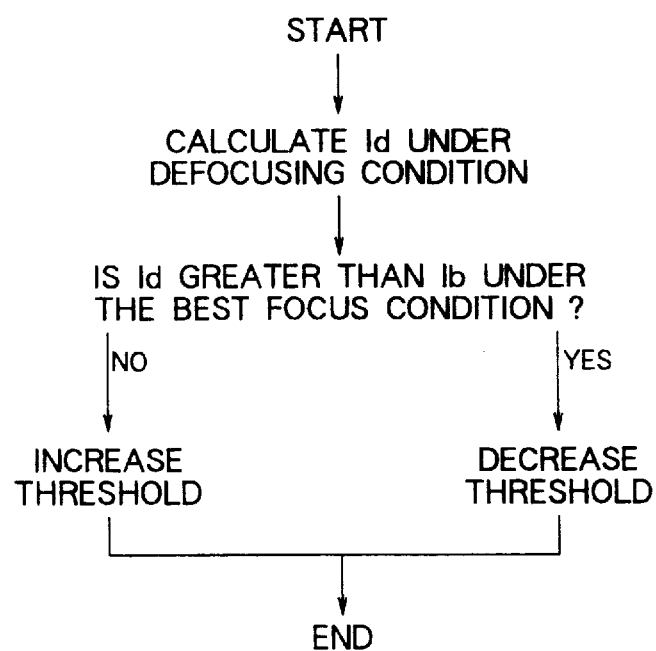

In embodiment 22, the threshold $I_{Th}$ may also be adjusted depending on the light intensity of an optical image obtained under a defocusing condition relative to the light intensity of the optical image obtained under a best focusing condition. As shown in FIG. 36, the light intensity Id of an optical image under a defocusing condition is calculated, and it is determined whether the light intensity Id is greater than the light intensity Ib of an optical image under a best focus condition. If the light intensity Id under the defocusing condition is greater than the light intensity Ib under the best focus condition, the size of a resist pattern will become small. Therefore, the threshold $I_{TH}$ is set to a low value so as to prevent the resist pattern size from becoming small. On the other hand, if the light intensity Id under the defocusing condition is smaller than the light intensity Ib under the best focus condition, the resist pattern size will become larger. In this case, the threshold $I_{TH}$ is set to a large value so as to prevent the resist pattern size from becoming large. Thus, in this embodiment, the focusing margin is effectively expanded.

EMBODIMENT 27

In embodiment 22, the threshold $I_{TH}$ may be adjusted depending on the slope of the projection image near the predicted mask edge. Afterward, the mask edge is predicted again using the new threshold value $I_{TH}$ obtained by the adjustment. As shown in FIGS. 19A and 19B, thresholds $I_{TH}$ are adjusted depending on the slopes of projection images near the mask edges of mask patterns 191 and 193 obtained in the first prediction. The edges of projection images are predicted again using the new thresholds $I_{TH}$ thereby predicting transferred patterns 192 and 194. In this embodiment, the slope of a projection image, that is, the slope of light intensity, can be taken into account in the pattern prediction. As a result, it is possible to achieve high accuracy pattern prediction.

EMBODIMENT 28

Figure 20:
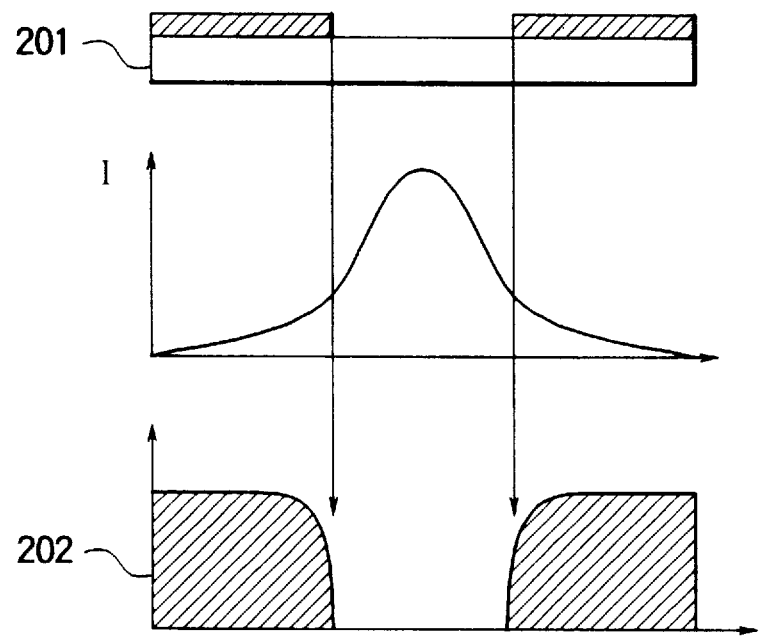

In this embodiment, as shown in FIG. 20, after generating a projection image on the basis of a mask pattern 201, the pattern prediction unit 4 simulates the development process of a resist on the surface of a wafer. A transferred pattern 202 is then predicted from the simulation result. In this embodiment, the variations in the process conditions such as an exposure amount and development time can be easily taken into account in the pattern prediction so that high accuracy pattern prediction can be achieved.

EMBODIMENT 29

Figure 21:
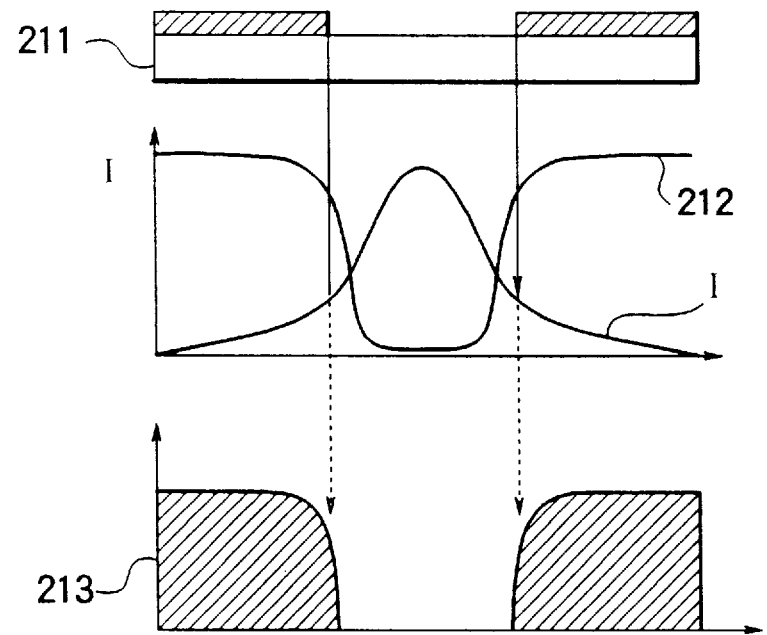

In this embodiment, as shown in FIG. 21, after generating a projection image on the basis of a mask pattern 211, the pattern prediction unit 4 converts the projection image to a distribution 212 of development time required to develop the resist on the surface of a wafer. The pattern prediction unit 4 further integrates the distribution 212 in a one-dimensional fashion thereby performing quasi-development. A transferred pattern 213 is then predicted from the result of the quasi-development. In this embodiment, as described above, pattern prediction can be performed more easily and more quickly than prediction on the basis of a simulation of resist development.

EMBODIMENT 30

Figure 37A:
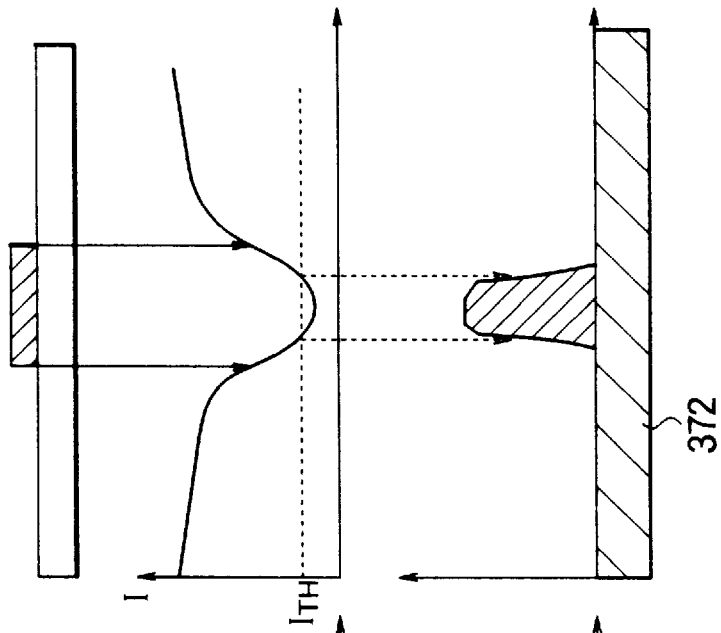
FIGS. 37A, 37B, 38A, 38B, 39A, 39B, and 39C are schematic representations of correction methods according to thirtieth and thirty-second embodiments, respectively, of the present invention.
Figure 37B:
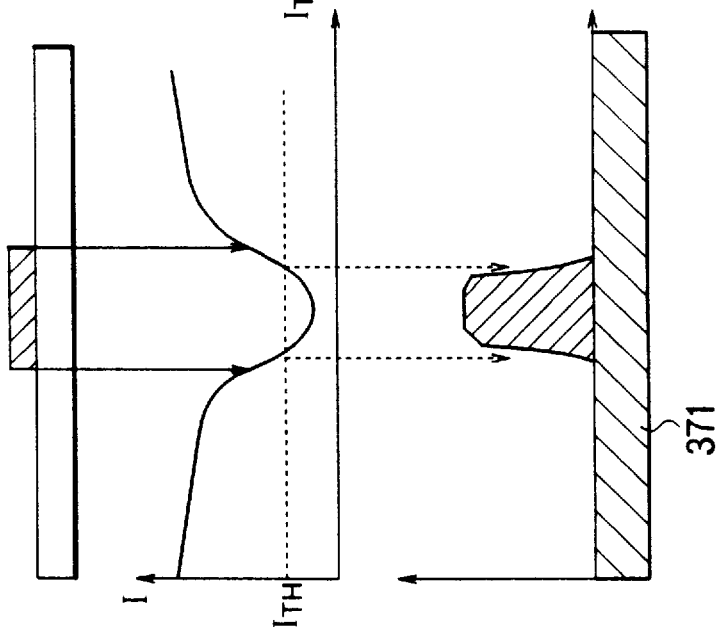

In the transfer pattern prediction step after generating a projection image from a mask pattern based on design data, the threshold $I_{TH}$ may be adjusted depending on the reflectivity of an underlying substrate coated with a resist which is to be formed into a pattern. As shown in FIG. 37A, in the case where an underlying substrate 371 is made of a material such as WSi having a low reflectivity, the light reflected by the substrate 371 has less influence on the exposure, and therefore the size of the resist pattern becomes greater when a positive-type resist is used. On the other hand, if an underlying substrate 372 is made of a material such as Al having a high reflectivity, the light reflected by the substrate 372 makes a considerable contribution to exposure and therefore the size of the resist patter becomes smaller when a positive-type resist is used. The threshold $I_{TH}$ is set to a high value for an underlying substrate having a low reflectivity as in the case of FIG. 37A, and the threshold $I_{TH}$ is set to a low value for an underlying substrate having a high reflectivity as in the case of FIG. 37B. In this embodiment the effect of the reflectivity of the underlying substrate is taken into account in the prediction of a transferred pattern and thus it is possible to achieve high accuracy and high processing speed in the pattern prediction.

EMBODIMENT 31

Figures 38A, 38B:
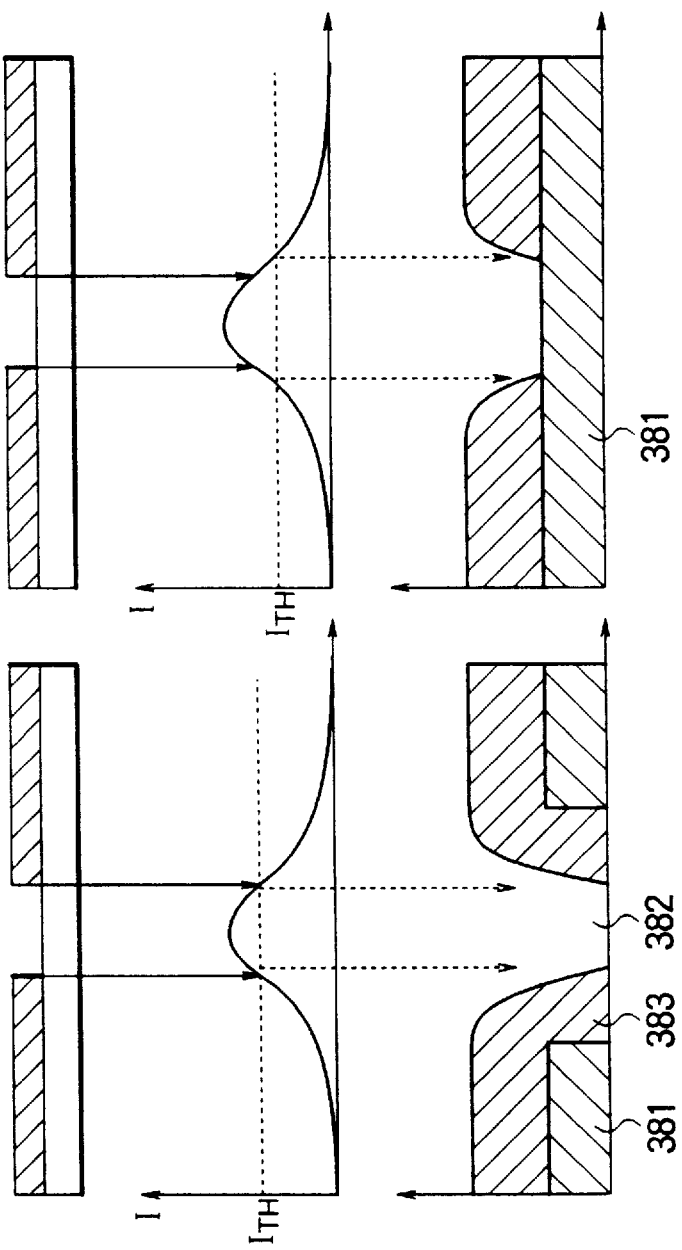

In the transfer pattern prediction step after generating a projection image from a mask pattern based on design data, the threshold $I_{TH}$ may be adjusted depending on steps formed on an underlying substrate coated with a resist in which a pattern is to be formed. In the example shown in FIG. 38A, an opening 382 and steps are formed on an underlying substrate 381 and the opening 382 and the steps are covered with a resist 383 wherein the thickness of the resist in the opening 382 is greater than that of the other portions. In such a case, the threshold $I_{TH}$ for the thick area is set to a large value. In this embodiment the effects of steps on an underlying substrate and the local variations in resist thickness are taken into account in the prediction of a transferred pattern and thus it is possible to achieve high accuracy in the pattern prediction.

EMBODIMENT 32

Figure 39A:
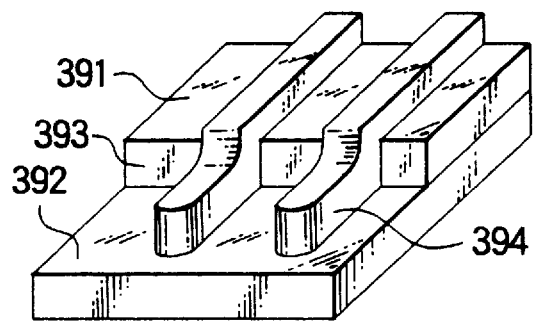
Figure 39B:
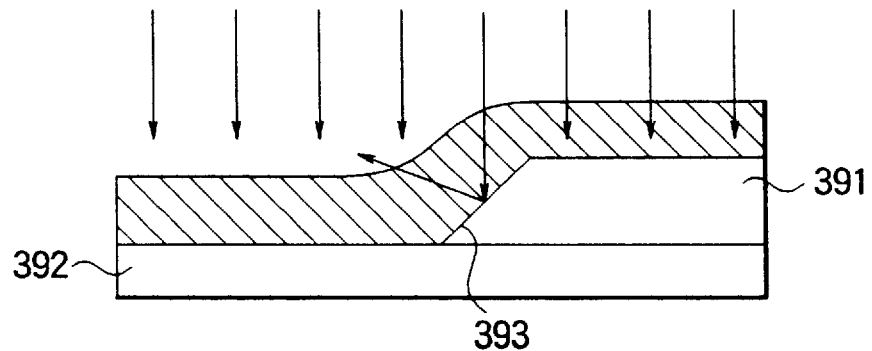
Figure 39C:
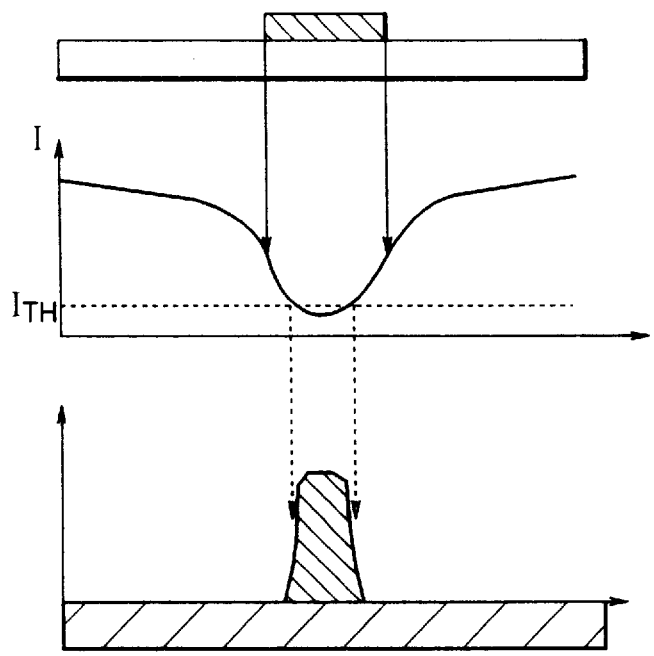

In the transfer pattern prediction step after generating a projection image from a mask pattern based on design data, the threshold $I_{TH}$ may be adjusted depending on halation produced on the surface of an underlying substrate coated with a resist into which a pattern is to be formed. For example, there is a large step 393 at the boundary between a memory cell area 391 and a peripheral circuit area 392 as shown in FIG. 39A. If bit lines 394 are formed so that they extend from the memory cell area 391 to the peripheral circuit area 392 across the step 393, halation occurs at the step 393 and a part of light is reflected in a horizontal direction as shown in FIG. 39B. In view of that fact, the threshold $I_{TH}$ for the area near the step is set to a lower value than for the other areas. In this embodiment the effect of halation at steps on an underlying substrate is taken into account in the prediction of a transferred pattern and thus it is possible to achieve high accuracy in the pattern prediction.

EMBODIMENT 33

Figure 22:
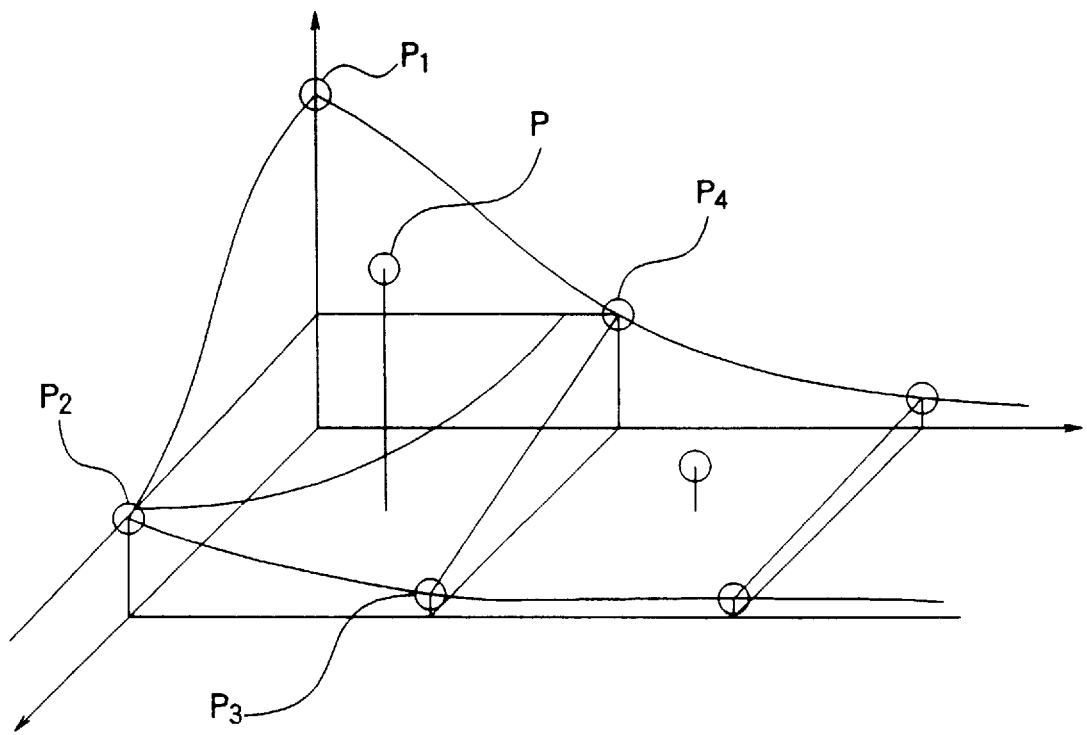
FIGS. 22, 23A, 23B, 24A, 24B, 25, 26A, 26B, 27A, 27B, 28A, and 28B are schematic representations of correction methods according to thirty-third to thirty-ninth embodiments, respectively, of the present invention.

The optical image calculation unit 3 of the embodiment 2 may calculate a projection image as follows. First, light intensities at predefined mesh points are calculated. Then, as shown in FIG. 22, the light intensity I at an arbitrary point P(x, y) is calculated from the already-determined light intensities at four neighboring points Pi(xi, yi) (i=1, 2, 3, 4) by means of interpolation according to the following equation:

$I=\Sigma i (Wi \cdot Ii)$ where $Wi=(1-|xi-x|)(1-|yi-y|)$. Thus, according to this method of calculating a projection image, it is possible to calculate the light intensity at an arbitrary point, even at a point on a boundary line of the mesh. As a result, it is possible to obtain a high-accuracy projection image.

EMBODIMENT 34

Figure 23A:
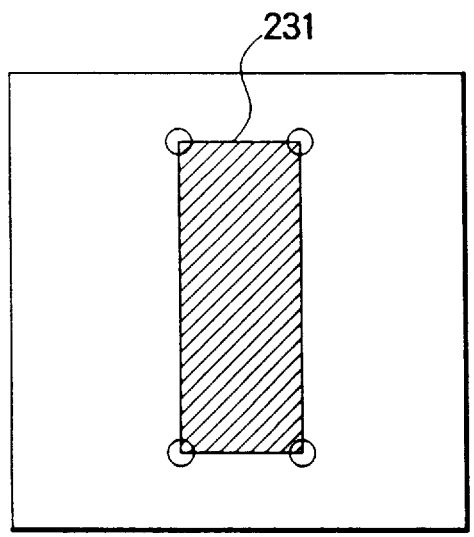
Figure 23B:
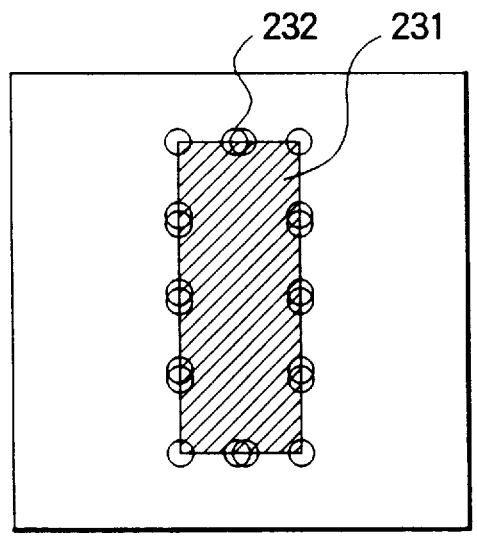

In the data correction processing in embodiment 2 or 3, the correction unit 6 divides each side of a pattern element 231 shown in FIG. 23A into a plurality of segments as shown in FIG. 23B, then performs corrections separately on each segment. In this embodiment, each dividing point 232 has two data for individual segments sharing that dividing point so that each segment can be corrected independently without affecting adjacent segments. Thus, this embodiment offers high-accuracy correction.

EMBODIMENT 35

Figure 24A:
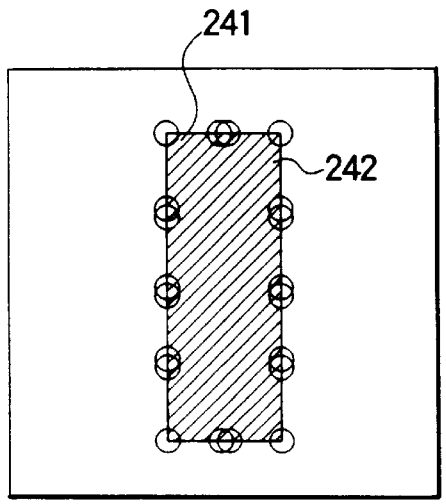
Figure 24B:
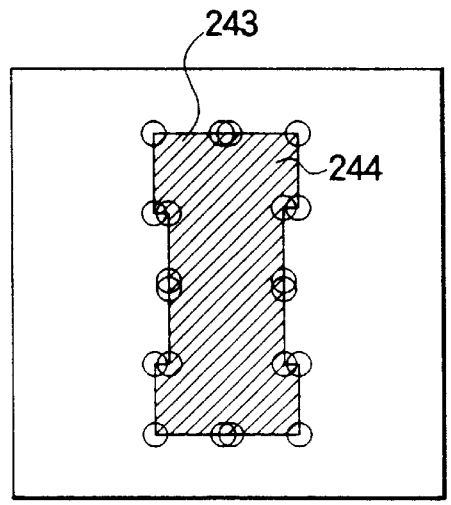

In the data correction process, the correction unit 6 corrects each side of a pattern element which should be corrected in a direction which is limited only to the direction perpendicular to each side For example, a side 242 of a pre-corrected pattern element 241 shown in FIG. 24A is corrected in a direction perpendicular to this side 242 so as to obtain a corrected pattern element 243 having a side 244. In this technique, correction produces no slanted sides and thus data can be compressed effectively and electron beam exposure can be performed at a high processing speed.

EMBODIMENT 36

Figure 25:
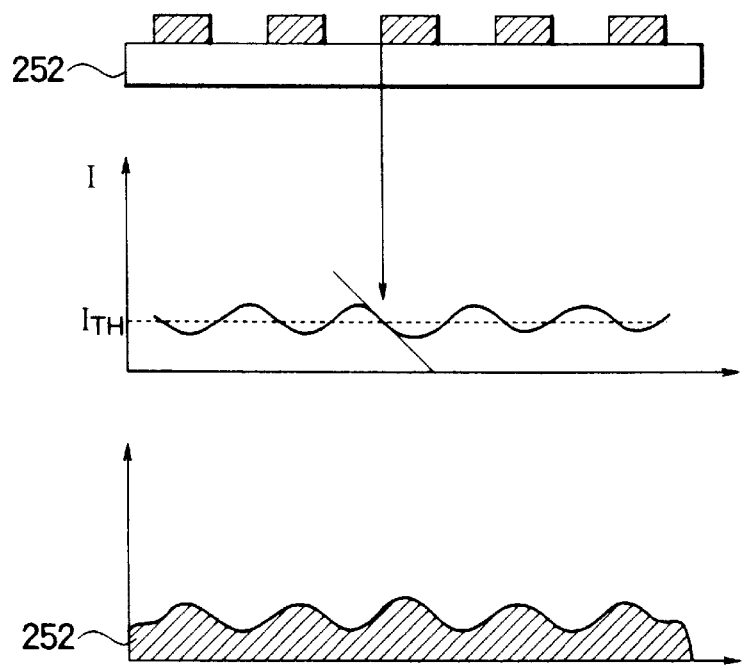

In the data correction process, if the edge gradient of the projection image of a pattern is steeper than a predetermined degree, the correction unit 6 may skip that side (edge) without performing a correction. For example, if a mask pattern 252 includes thin pattern elements arranged close to each other as shown in FIG. 25, the transferred pattern 252 becomes unclear and thus inaccurate. In this case, the edge gradient of the projection image of the mask pattern 251 becomes less steep. In this embodiment, as described above, when the edge gradient of the projection image of a pattern is steeper than a predetermined degree, the side is skipped without being subjected to correction thereby preventing invalid correction. This offers high reliability in the light proximity correction.

EMBODIMENT 37

Figure 26A:
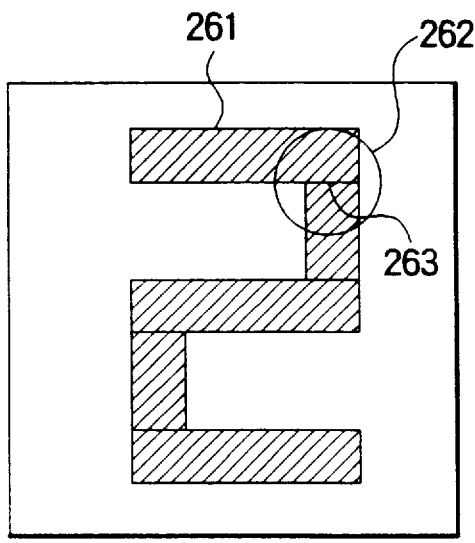
Figure 26B:
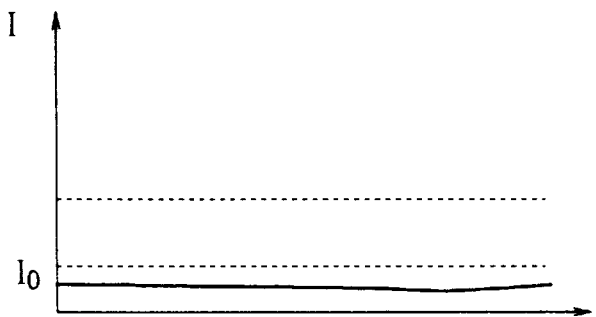

In the data correction process, if the light intensity of the projection image of a pattern is less than a predetermined threshold for a certain side of the pattern, the correction unit 6 may skip that side (edge) without performing a correction. In FIG. 26A, for example, the side 263 shown in the circle 262 is located inside a pattern element 261 and therefore this side 263 does not require light proximity correction and this side 263 should be skipped in the correction process. In such a case, the light intensity of the projection image of the 263 is very low as shown in FIG. 26B because the side 262 is located inside the pattern element 261. In this embodiment if the light intensity of the projection image of a side of a pattern is less than a threshold $I_0$, the side is skipped in the correction process so that invalid correction is prevented and high reliability is achieved in the light proximity correction.

EMBODIMENT 38

Figure 27A:
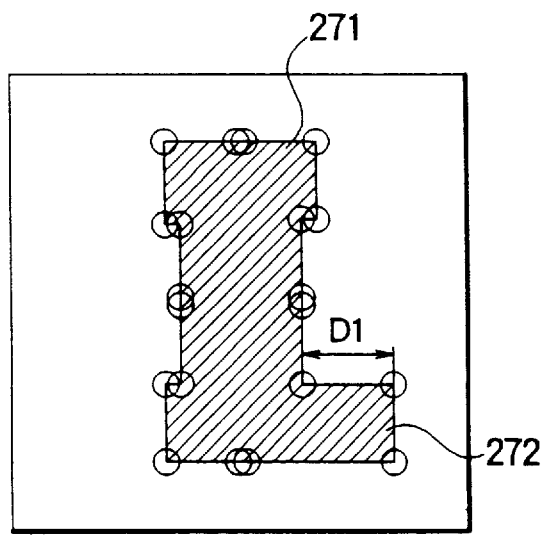
Figure 27B:
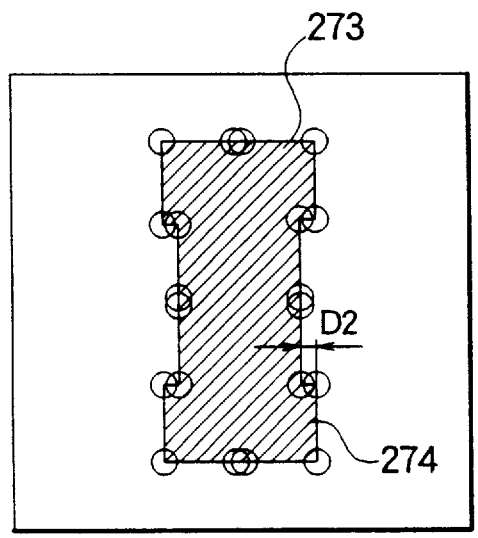

In the data correction process, if the correction unit 6 detects that a correction is greater than a predefined upper limit, the correction unit 6 considers the correction to be invalid and employs a value equal to the upper limit as the correction. For example, as shown in FIG. 27A, if the correction amount D1 for a side 272 of a pattern element 271 is greater than an upper limit D2, the correction amount D1 is replaced by the upper limit D2 so that the side 272 becomes a side 274 in the corrected pattern element 273 as shown in FIG. 27B. This prevents an invalid correction and thus offers high reliability in the light proximity correction.

EMBODIMENT 39

Figure 28A:
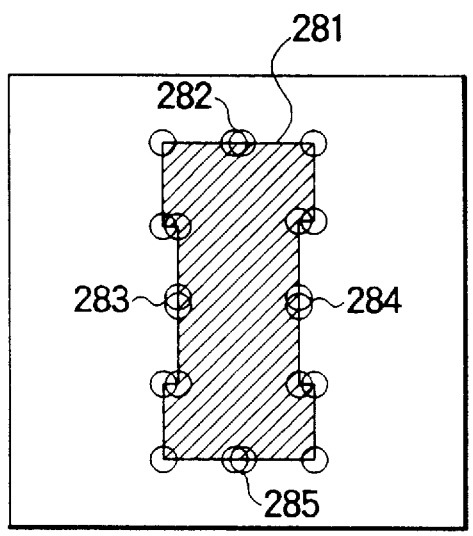
Figure 28B:
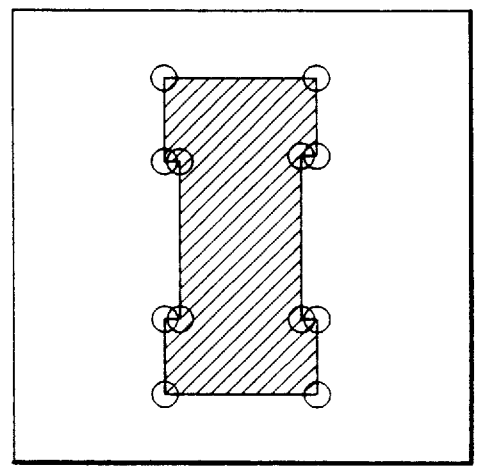

In the data correction process, the correction unit 6 may remove redundant points which lie on the same line after correcting a side of a pattern. For example, as shown in FIG. 28A, after a correction process, a pattern 281 has redundant points 282 to 285 lying on lines, wherein these redundant points 282 to 295 are no longer necessary after the completion of the correction process. Therefore, the correction unit 6 removes these points 282 to 285 and produces a pattern such as that shown in FIG. 28B. Thus, data can be compressed in an effective fashion, and iterative calculations in the correction process can be performed in a short time.

EMBODIMENT 40

In step S6 in embodiment 2 or 3, if the correction amount is not within the allowable range, a projection image is generated and correction is performed again. In this embodiment, instead of judging the correction amount each time a side is corrected and iterating the correction process, the correction amount is judged after all sides have been corrected separately, and the correction procedure is repeated as required. This results in an increase in the correction processing speed. Furthermore, since each side is corrected independently, there is little possibility that the correction will become asymmetric, and thus it is possible to achieve high reliability in the correction process.

EMBODIMENT 41

Figure 54:
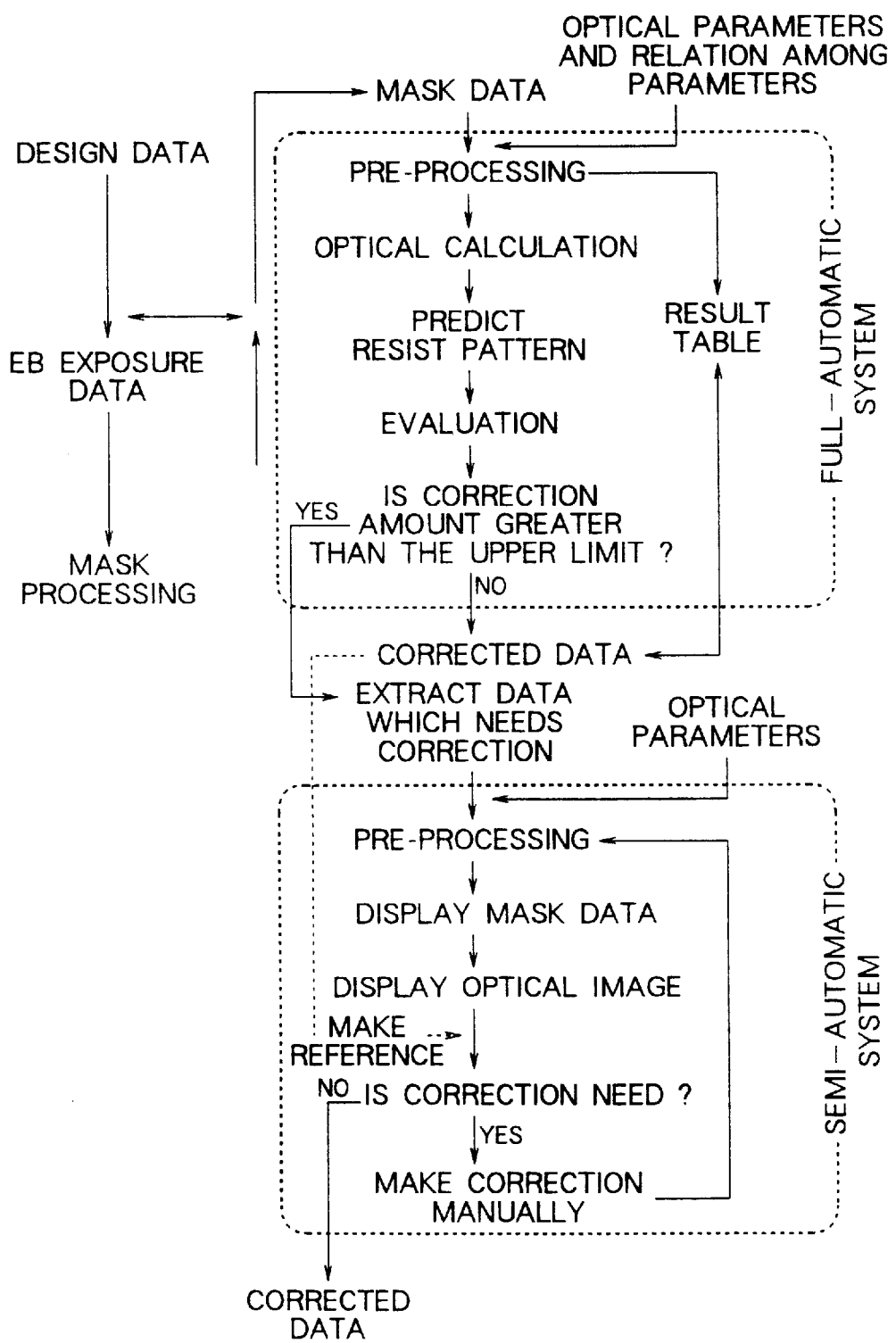
FIG. 54 is a schematic representation of a correction method according to a forty-first embodiment of the present invention.

In embodiment 2 or 3, after dividing the design data into a plurality of data blocks and calculating the correction amount for each data block, the correction amount is evaluated. If it is detected that the correction amount for a certain data block is not within an allowable range, then such a data block may be extracted and stored in a separate file whereas the corrected data of the data blocks which have succeeded in obtaining a correction amount within the allowable range is output. For example, as shown in FIG. 54, after performing pre-processing on the mask data, a resist pattern is predicted by means of optical calculation, and the predicted resist pattern is evaluated by comparing it with the mask data. That is, the difference between the size of the predicted pattern and the size designated by the mask data is determined as the correction amount. If the correction amount is greater than 10% of the minimum size, for example 0.3 $\mu$m, then data blocks having such a correction amount are extracted and stored in a separate file.

This makes it possible to extract only those regions which need correction or have a too small process margin from an LSI pattern including a huge amount of data. This technique is especially useful for random logic circuits to improve development efficiency. The data which has been extracted for the correction in the above-described manner is subjected to pre-processing using optical parameters and the calculated projection image and the corresponding mask data are displayed. Referring to the corrected data of the data blocks which have already succeeded in achieving a correction amount within the allowable range, it is determined whether or not correction is needed from the displayed projection image. If correction is needed, correction is performed manually, and the mask data and the projection image are displayed again for re-evaluation. The manual correction and the displaying of the mask data and the projection image are performed repeatedly until it is determined that no further correction is needed. When it is concluded that no further correction is needed, the resultant corrected data are output.

The present invention provides not only a full-automatic light proximity correction system in which correction is performed from block to block, but also a semi-automatic light proximity correction system with which an operator can manually correct the extracted data. This is especially useful to achieve effective correction when fully automatic system is not good enough, particularly for a special pattern, or when it is desirable to monitor the optical image during a correction process.

EMBODIMENT 42

Figure 40A:
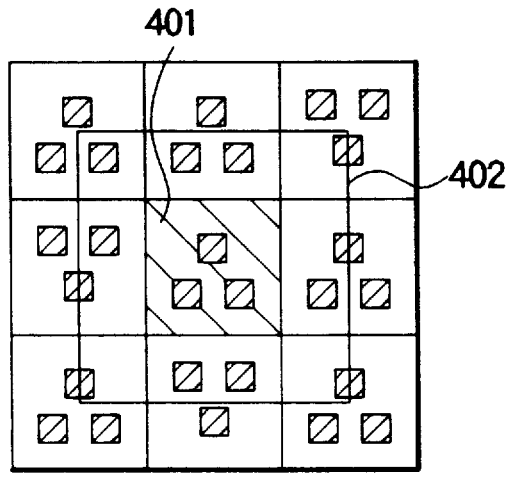
FIGS. 40A and 40C are schematic representations of a correction method according to a forty-second embodiment of the present invention.
Figure 40B:
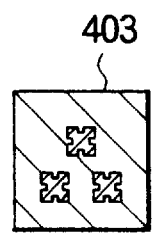
Figure 40C:
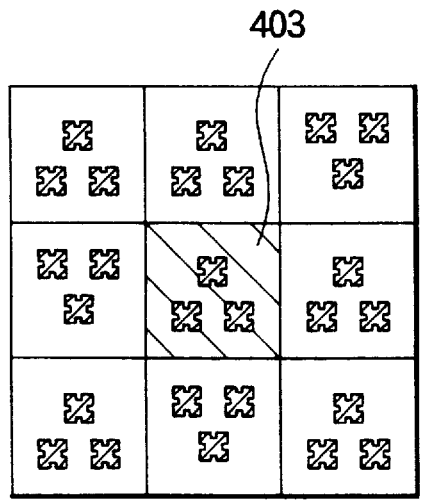

In the embodiment 2 or 3, as described in FIG. 40A, after dividing design data into a plurality of data blocks and disposing a buffer area 402 around each data block 401, a correction process is performed. After that, in the data expansion process (step S7), if the buffer area around each data block is removed as shown in FIG. 40B and the corrected data including no buffer area is stored, then the data can be expanded as shown in FIG. 40C with more-effectively compressed corrected data.

What is claimed is:

1. A light proximity correction system comprising:
   a design data input unit for receiving design data of a circuit pattern;
   a data compression unit for compressing the design data received via said design data received unit;
   an optical image formation unit for forming an optical projection image used to transfer a pattern onto a wafer according to the design data input via said design data input unit;
   a prediction unit for predicting the size of the pattern which will be transferred onto the wafer, the prediction being performed on the basis of the projection image formed by said optical image formation unit;
   a comparison unit for calculating the difference between the size of the transfer pattern predicted by said prediction unit and the size of the pattern designated by the design data input via said design data input unit;
   a correction unit for correcting the design data compressed by said data compression unit by an amount equal to the difference determined by said comparison unit;
   a data expansion unit for expanding the data corrected by said correction unit; and
   a corrected data output unit for outputting the data expanded by said data expansion unit.

2. The system according to claim 1, comprising a determination unit for determining whether the correction amount used by said correction unit is within an allowable range, and making said optical image formation unit reform the projection image according to the corrected data if the correction amount is not within the allowable range, wherein said determination unit outputs the corrected data to said data expansion unit if the correction amount is within the allowable range.

3. The system according to claim 1, wherein said optical image formation unit includes a CPU for determining the projection image by a of calculation process.

4. The system according to claim 3, wherein said optical image formation unit includes a plurality of CPUs for performing the calculating process on the divided design data in a parallel fashion.

5. The system according to claim 1, wherein said optical image formation unit includes an optical system for measuring the projection image.

6. The system according to claim 5, wherein said optical image formation unit includes a plurality of optical systems for dividing the design data into plural parts and measuring the projection image corresponding to the divided design data in a parallel fashion.

7. The system according to claim 1, wherein:
   said data compression unit, said data expansion unit, and said corrected data output unit are part of a master CPU dividing the design data into a plurality of data blocks and performing a process common to all data blocks; and
   said optical image formation unit, said prediction unit, said comparison unit, and said correction unit are part of a plurality of slave CPUs performing optical calculations regarding corresponding data blocks in a parallel fashion, using results of the common process produced by said master CPU, and transmitting results to said master CPU.

8. A light proximity correction method comprising:
   compressing design data of a circuit pattern;
   forming an optical projection image used to transfer a pattern onto a wafer according to the design data;
   predicting the size of the pattern which will be transferred onto the wafer, on the basis of the projection image;
   correcting the design data by the difference between the predicted size of the transfer pattern and the size of the pattern designated by the design data;
   expanding the corrected data; and
   outputting the expanded data.

9. The method according to claim 8, wherein compressing the design data includes dividing the design data into a plurality of data blocks.

10. The method according to claim 9, wherein a buffer area is disposed around each data block.

11. The method according to claim 9, including determining whether pattern elements in each data block have sides spaced apart from each other by a distance no larger than a predetermined value and, if such sides are detected in a certain data block, subjecting the data block to a correction process.

12. The method according to claim 9, including subjecting only data blocks including a side of a pattern element are to the correction process, and skipping data blocks including no side of a pattern element in the correction process.

13. The method according to claim 9, wherein if a plurality of data blocks include an identical pattern element, subjecting only one of those data blocks is to the correction process, and applying the correction result to the other data blocks.

14. The method according to claim 9, including dividing the design data into a plurality of data blocks having a period equal to the period of a memory cell pattern for the design data of a memory cell array.

15. The method according to claim 9, including combining a plurality of pattern elements located adjacent to each other into a polygon.

16. The method according to claim 9, wherein, when a plurality of pattern elements located adjacent to each other in each data block are combined, if the resultant pattern includes an open area inside the pattern, describing the resultant pattern by a pattern element that defines an outer periphery and a pattern element that defines an inner space area.

17. The method according to claim 9, wherein when a variable light source is employed in an exposure apparatus, skipping a light-masking pattern having a size less than a period corresponding to the three-light-ray cutoff frequency is in the correction process.

18. The method according to claim 11, wherein, when a variable light source is employed in an exposure apparatus, if the sides are spaced apart from each other by a distance that is no larger than a predetermined value and that is no less than a period corresponding to three-light-ray cutoff frequency, correcting those sides by adding a constant correction amount.

19. The method according to claim 8, wherein in the step of predicting the size of a transfer pattern, predicting a mask edge is predicted from the projection image by employing a predetermined light intensity as a threshold value.

20. The method according to claim 19, including adjusting the threshold value depending on the light intensity near a side of a pattern to be corrected.

21. The method according to claim 19, including adjusting the threshold value depending on the two-dimensional light intensity distribution near a side of a pattern to be corrected.

22. The method according to claim 19, including adjusting the threshold value depending on whether there is a pattern element adjacent to a side of a pattern to be corrected.

23. The method according to claim 19, including adjusting the threshold value depending on the light intensity of an optical image under a defocusing condition relative to the light intensity of the optical image under a best focusing condition.

24. The method according to claim 19, including adjusting the threshold value depending on the reflectivity of an underlying substrate onto which a pattern is to be transferred.

25. The method according to claim 19, including adjusting the threshold value depending on a step formed on an underlying substrate onto which a pattern is to be transferred.

26. The method according to claim 19, including adjusting the threshold value depending on halation occurring at the surface of an underlying substrate onto which a pattern is to be transferred.

27. The method according to claim 19, including adjusting the threshold value depending on the relationship between a resist pattern formed by actually exposing a resist to a reference pattern and an optical image of the reference pattern, the optical image being calculated from reference mask data.

28. The method according to claim 19, including adjusting the threshold value depending on the relationship between an etching pattern, formed by actually exposing a resist to a reference pattern and etching, and an etching pattern calculated from an optical image of the reference pattern, the optical image being calculated from reference mask data.

29. The method according to claim 19, including adjusting the threshold value depending on the relationship between a reference pattern, formed by actually performing electron beam exposure according to reference mask data, and an electron beam exposure pattern calculated from the reference mask data.

30. The method according to claim 19, including adjusting the threshold value depending on the relationship between a reference pattern, formed by actually performing laser beam exposure according to reference mask data, and a laser beam exposure pattern calculated from the reference mask data.

31. The method according to claim 19, including adjusting the threshold value depending on the relationship between a resist pattern, formed by actually exposing a resist to a reference pattern, and an optical image calculated from a pattern size obtained by measuring the reference pattern.

32. The method according to claim 19, including adjusting the threshold value depending on the relationship between an etching pattern formed by actually exposing a resist to a reference pattern and etching using the resist pattern, and an etching pattern calculated from a pattern size obtained by measuring the resist pattern.

33. The method according to claim 19, including adjusting the threshold value depending on the relationship between a resist pattern formed by actually exposing a resist to a reference pattern, the reference pattern being formed by actually performing electron beam exposure according to reference mask data, and an optical image calculated from an electron beam exposure pattern, the electron beam exposure pattern being calculated from the reference mask data.

34. The method according to claim 19, including adjusting the threshold value depending on the relationship between a resist pattern formed by actually exposing a resist to a reference pattern, the reference pattern being formed by actually performing laser beam exposure according to reference mask data, and an optical image calculated from a laser beam exposure pattern, the laser beam exposure pattern being calculated from the reference mask data.

35. The method according to claim 19, including adjusting the threshold value depending on the relationship between an etching pattern, formed by actually exposing a resist to a reference pattern and etching and an etching pattern calculated from an optical image, the optical image being calculated from a pattern size obtained by measuring the reference pattern.

36. The method according to claim 19, including adjusting the threshold value depending on the relationship between an etching pattern formed by actually exposing a resist to a reference pattern and etching, the reference pattern being formed by actually performing electron beam exposure according to reference mask data, and an etching pattern calculated from an optical image, the optical image being calculated from an electron beam exposure pattern, the electron beam exposure pattern being calculated from the reference mask data.

37. The method according to claim 19, including adjusting the threshold value depending on the relationship between an etching pattern formed by actually exposing a resist to a reference pattern and etching, the reference pattern being formed by actually performing laser beam exposure according to reference mask data, and an etching pattern calculated from an optical image, the optical image being calculated from a laser beam exposure pattern, the laser beam exposure pattern being calculated from the reference mask data.

38. The method according to claim 8, wherein said predicting the size of a transfer pattern includes:
    predicting a mask edge from the projection image by employing a predetermined light intensity as a threshold value;
    adjusting the threshold value depending on the gradient of the projection image at the predicted mask edge; and
    predicting a mask edge using the adjusted threshold value;
    thereby predicting the size of the transfer pattern.

39. The method according to claim 8, wherein predicting the size of a transfer pattern includes:
    simulating a process of developing a resist disposed on the surface of a wafer; and
    predicting the size of the transfer pattern from an edge position obtained in said simulating step.

40. The method according to claim 8, wherein predicting the size of a transfer pattern includes:
    converting the projection image to a developing time distribution required to develop a resist disposed on the surface of a wafer;
    simulating a development process by performing one-dimensional integration of said developing time; and
    predicting the size of the transfer pattern from an edge position obtained in the simulating step.

41. The method according to claim 8, wherein forming a projection image includes calculating the light intensity I at a point P(x, y) from light intensities at four neighboring points Pi(xi, yi) (i=1, 2, 3, 4) selected so that the point P(x, y) is present inside a rectangle formed by four neighboring points Pi(xi, yi) (i=1, 2, 3, 4), the calculation of the light intensity I at the point P(x, y) and interpolating according to
    $I = \Sigma i(Wi \cdot Ii)$, and
    $Wi = (1-|xi-x|)(1-|yi-Y|)$.

42. The method according to claim 8, wherein correcting the design data includes:
    dividing a side to be corrected into a plurality of segments at dividing points having two data items so that segments sharing one dividing point have respective data item.

43. The method according to claim 8, wherein in said step of correcting the design data, correcting each side in a direction perpendicular to the side.

44. The method according to claim 8, including in correcting the design data, correcting if the gradient of the projection image at a side of a pattern element is less than a predetermined value, skipping the side so that the side is not subjected to the correction process.

45. The method according to claim 8, including in correcting the design data, if the light intensity of the projection image at a side of a pattern element is less than a predetermined value, skipping the side so that the side is not subjected to the correction process.

46. The method according to claim 8, including in correcting the design data, an upper limit of a correction amount is set, and if a calculated correction amount is greater than the upper limit, making correction equal to the upper limit.

47. The method according to claim 8, wherein correcting the design data includes, after correction each side of a pattern element that should be corrected, removing redundant points lying on the same line.

48. The method according to claim 8, wherein said correcting the design data includes:
    separately correcting all sides which should be corrected;
    determining whether the corrections are within an allowable range;
    forming a projection image according to the corrected data, if some correction is not within the allowable range; and
    expanding the corrected data and outputting the expanding data, if the corrections are within the allowable range.

49. The method according to claim 48, wherein compressing the design data includes:
    dividing the design data into a plurality of data blocks;
    determining the correction amount for each data block;
    extracting a data block having a correction not within an allowable range and storing the extracted data block in a separate file; and
    correcting the extracted data block according to the corrected data.

50. The method according to claim 49, including:
    manually correcting the mask data of the extracted data block;
    determining from the projection image whether further correction is needed;
    if further correction is needed, repeatedly manually correcting the mask data, forming projection images, and determining until no further correction is needed; and
    expanding and outputting the corrected data.

51. The method according to claim 10, wherein in expanding the corrected data, to expanding the corrected data after removing the buffer areas disposed around individual data blocks.

* * * * *

UNITED STATES PATENT AND TRADEMARK OFFICE
CERTIFICATE OF CORRECTION

PATENT NO. : 5,815,685
DATED : September 29, 1998
INVENTOR(S) : Kazuya Kamon

It is certified that error appears in the above-identified patent and that said Letters Patent is hereby corrected as shown below:

Column 20, Line 26, delete "of";

Column 21, Line 10, delete "are";

Line 15, delete "is";

Line 36, delete "is";

Line 44, after "wherein" insert --,--;

Line 46, delete is predicted;

Column 22, Line 64, after "etching" (1st occurrence) insert --,--;

Column 23, Line 21, delete "said";

Line 53, change "$(1-|yi-Y|)$" to --$(1-|yi-y|)$--;

UNITED STATES PATENT AND TRADEMARK OFFICE
CERTIFICATE OF CORRECTION

PATENT NO. : 5,815,685
DATED : September 29, 1998
INVENTOR(S) : Kazuya Kamon

It is certified that error appears in the above-identified patent and that said Letters Patent is hereby corrected as shown below:

Column 24, Line 1, change "wherein" to --including--;

Line 1 and 2, delete "said step of";

Line 4, after "including" insert --,--;

Line 5, delete "correcting";

Line 9, after "including" insert --,--;

Line 14, after "including" insert --,--;

Line 17, after "making" insert --a--;

UNITED STATES PATENT AND TRADEMARK OFFICE
CERTIFICATE OF CORRECTION

PATENT NO.   : 5,815,685
DATED        : September 29, 1998
INVENTOR(S)  : Kazuya Kamon It is certified that error appears in the above-identified patent and that said Letters Patent is hereby corrected as shown below:

Column 24, Line 22, delete "said";

Line 55, delete "to".

Signed and Sealed this

Thirtieth Day of March, 1999

Q. TODD DICKINSON

*Attest:*

*Attesting Officer*        Acting Commissioner of Patents and Trademarks